(12) United States Patent
Hines et al.

(10) Patent No.: US 9,537,677 B2
(45) Date of Patent: Jan. 3, 2017

(54) INDIVIDUALLY IDENTIFIABLE SURFACE ACOUSTIC WAVE SENSORS, TAGS AND SYSTEMS

(71) Applicant: APPLIED SENSOR RESEARCH & DEVELOPMENT CORPORATION, Arnold, MD (US)

(72) Inventors: Jacqueline H. Hines, Annapolis, MD (US); Leland P. Solie, Apopka, FL (US); Dana Y. G. Tucker, Acton, MA (US); Andrew T. Hines, Annapolis, MD (US)

(73) Assignee: SenSanna Incorporated, Arnold, MD (US)

( * ) Notice: Subject to any disclaimer, the term of this patent is extended or adjusted under 35 U.S.C. 154(b) by 438 days.

(21) Appl. No.: 13/694,889

(22) Filed: Jan. 16, 2013

(65) Prior Publication Data

US 2013/0181573 A1     Jul. 18, 2013

Related U.S. Application Data

(60) Provisional application No. 61/586,983, filed on Jan. 16, 2012.

(51) Int. Cl.
*H01L 41/08* (2006.01)
*H04L 25/02* (2006.01)
(Continued)

(52) U.S. Cl.
CPC ............. *H04L 25/02* (2013.01); *H01L 41/08* (2013.01); *H03H 9/25* (2013.01); *H03H 9/6406* (2013.01);
(Continued)

(58) Field of Classification Search
USPC ............ 310/313 R, 313 D, 313 B, 318, 340; 340/572.1, 572.2, 572.5; 333/193, 135, 333/196; 375/295
See application file for complete search history.

(56) References Cited

U.S. PATENT DOCUMENTS

| 7,005,987 B2 * | 2/2006 | Sinnett ................ B60C 23/0433 340/442 |
| 7,053,524 B2 * | 5/2006 | Edmonson ........... G01N 29/022 310/313 D |

(Continued)

OTHER PUBLICATIONS

SAW Device Implementation of a Weighted Stepped Chirp Code Signal for Direct Sequence Spread Spectrum Communications Systems Scott E. Carter, Member, IEEE, and Donald C. Malocha, Member, IEEE.*

*Primary Examiner* — Thomas Dougherty
*Assistant Examiner* — Karen B Addison
(74) *Attorney, Agent, or Firm* — Nixon Peabody LLP; Jeffrey L. Costellia

(57) ABSTRACT

A surface-launched acoustic wave sensor tag system for remotely sensing and/or providing identification information using sets of surface acoustic wave (SAW) sensor tag devices is characterized by acoustic wave device embodiments that include coding and other diversity techniques to produce groups of sensors that interact minimally, reducing or alleviating code collision problems typical of prior art coded SAW sensors and tags, and specific device embodiments of said coded SAW sensor tags and systems. These sensor/tag devices operate in a system which consists of one or more uniquely identifiable sensor/tag devices and a wireless interrogator. The sensor device incorporates an antenna for receiving incident RF energy and re-radiating the tag identification information and the sensor measured parameter(s). Since there is no power source in or connected to the sensor, it is a passive sensor. The device is wirelessly interrogated by the interrogator.

4 Claims, 24 Drawing Sheets
(14 of 24 Drawing Sheet(s) Filed in Color)

(51) Int. Cl.
*H03H 9/25* (2006.01)
*H03H 9/64* (2006.01)
*H04B 1/69* (2011.01)
*H04J 13/10* (2011.01)

(52) U.S. Cl.
CPC ............... *H04B 1/69* (2013.01); *H04J 13/107* (2013.01); *H04B 2001/6912* (2013.01)

(56) References Cited

U.S. PATENT DOCUMENTS 7,132,778 B1 * 11/2006 Nysen .................... G01S 13/755
310/313 D
7,825,805 B2 * 11/2010 Malocha .............. H03H 9/6406
333/193

* cited by examiner

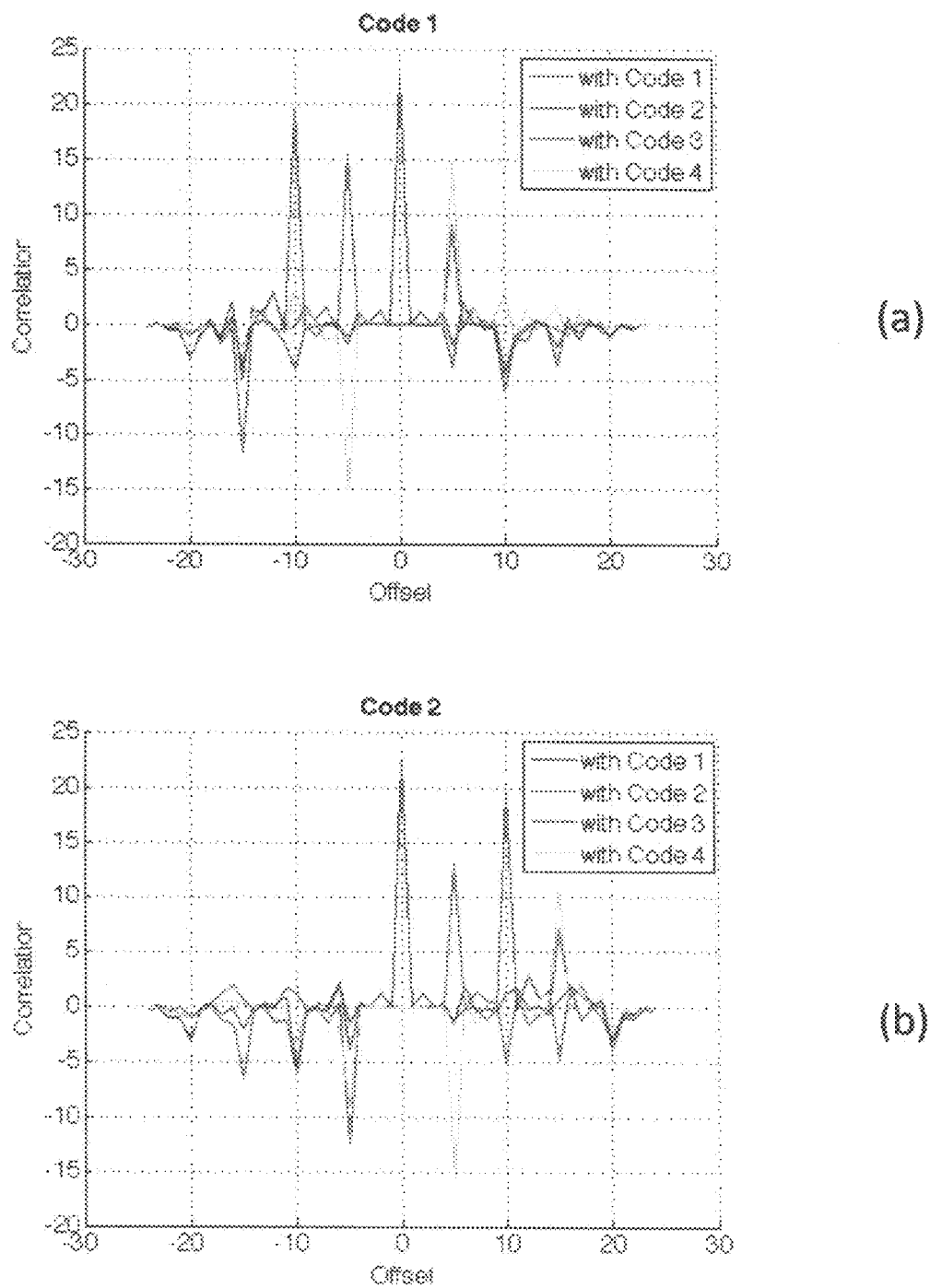
Figure 11 (part 1 of 2)

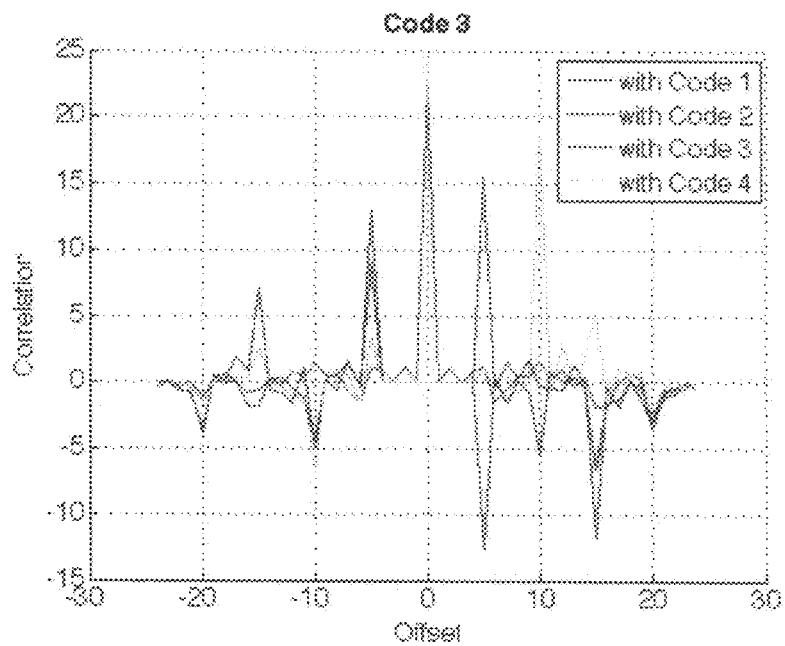
(c)
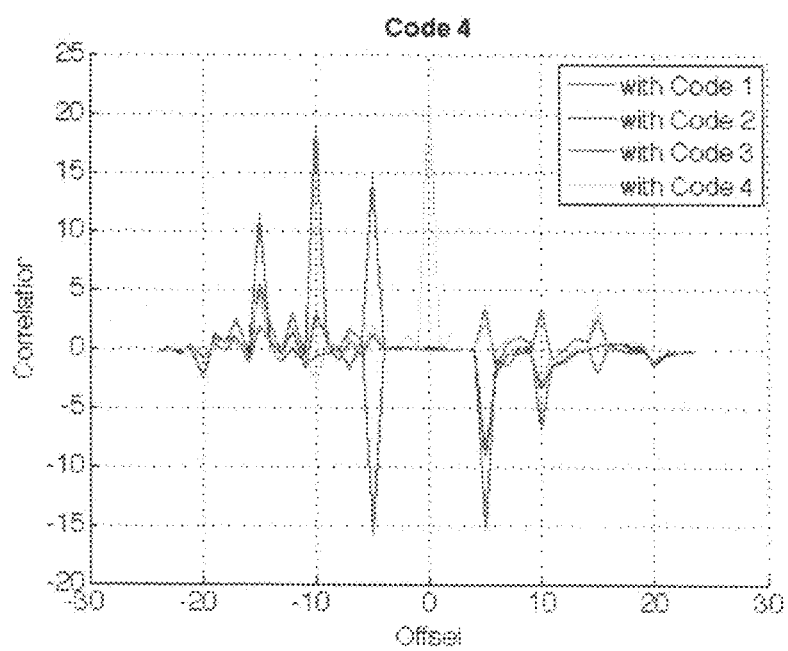
(d)
Figure 11 (part 2 of 2)

INDIVIDUALLY IDENTIFIABLE SURFACE ACOUSTIC WAVE SENSORS, TAGS AND SYSTEMS

CROSS-REFERENCE TO RELATED APPLICATIONS

This application claims the benefit of U.S. Provisional Application No. 61/586,983, filed Jan. 16, 2012, herein incorporated by reference in its entirety.

STATEMENT REGARDING FEDERALLY SPONSORED RESEARCH OR DEVELOPMENT

This invention was made with government support under contract NNX10CD41P awarded by the National Aeronautics and Space Administration (NASA). The government has certain rights in the invention.

BACKGROUND OF THE INVENTION

Field of the Invention

Embodiments of the present invention relate to apparatus, systems, devices, and methods for remotely sensing and/or providing identification information using sets of surface acoustic wave (SAW) based sensor tag devices and systems incorporating such devices. In particular, embodiments of the present invention relate to improved methods for implementing coding and other diversity techniques within SAW sensors and tags to produce sets of individually identifiable devices that interact minimally, reducing or alleviating code collision problems typical of prior art coded SAW sensors and tags, and to specific embodiments of said coded SAW sensors, tags, sensor tags, and systems. These sensor/tag devices operate in a system which consists of one or more uniquely identifiable sensor/tag devices and an interrogator to wirelessly query the sensor/tag devices and receive and interpret the device responses. The sensor device incorporates an antenna for receiving incident RF energy and re-radiating the tag identification information and the sensor measured parameter(s). Since there is no power source in or connected to the sensor, it is a passive sensor.

Description of Related Art

Acoustic Wave Sensors: Sensors based on surface-launched acoustic wave devices have been developed since the 1980's for application to physical measurements (temperature, pressure, torque, strain, etc.) and to a wide range of chemical and biological detection problems. These widely varying devices have utilized several operating modes and corresponding wave propagation modes, including the traditional Rayleigh wave (or Surface Acoustic Wave—SAW), the surface transverse wave (STW), the surface skimming bulk wave (SSBW), the SSBW that has been guided to the surface via a layer, known as the Love wave, the shear-horizontally polarized acoustic plate mode (SH-APM), the flexural plate wave (FPW) or Lamb wave, the layer guided acoustic plate mode (LG-APM), and the thickness shear mode (TSM) bulk wave (as used in the quartz crystal microbalance—QCM), and the layer guided shear horizontal acoustic plate mode (LG-SHAPM). A number of different device types have been recognized using these diverse wave modes, including resonators, delay lines, differential delay lines, and reflective delay lines (tag or ID devices). These devices have been operated within a wide range of wired and wireless interrogation system architectures, which have generally been designed specifically to operate with the selected sensor(s). In most cases, wireless interrogation has been applied to physical sensors, and not to biological or chemical sensors. These system architectures include pulsed radar-like delay measurement systems, Fourier transform based measurement systems, and delay line and resonator-based oscillator systems. A time-integrating correlator based interrogation system has also been introduced by the inventors of the embodiments of the present invention. The system architecture has usually been selected based on specific device characteristics and application requirements, and generally involves absolute or differential measurements of sensor frequency, phase, delay, amplitude, or power spectral density, and changes in these quantities with exposure to changes in target parameters, to provide the output sensor measurement. Historically, signal amplitude has only been used as a measurand for devices operated in a wired mode, due to the variation in response amplitude caused by changes in distance between the interrogation system and the sensor(s), with the exception of the differential power spectral density measurement approach recently introduced by the inventors of the embodiments of the present invention.

The properties and relative advantages of each acoustic wave mode and device type make them suitable for different applications. Rayleigh wave sensors, for instance, involve substrate particle displacements that include a component normal to the substrate surface. When used in a liquid, this component generates a compressional wave in the liquid, causing wave energy to leak into the liquid. This energy leakage results in large attenuation of the Rayleigh wave, often referred to as "damping". This effect makes Rayleigh waves not useful for sensing in the liquid phase, although they remain very useful for gas phase sensing and measurements of physical parameters such as temperature, pressure, strain, and torque, along with use as hermetically sealed tag wireless interface devices for external sensors of various kinds. This energy leakage occurs whenever the wave motion in the substrate involves a component of displacement normal to the substrate surface, and the speed of the sound wave in the device is greater than the speed of sound in the liquid (or in the layer coating the device). Certain wave modes, such as flexural plate waves (FPWs), do involve a normal component of displacement, but have wave velocities lower than the speed of sound in the liquid. Leakage therefore does not occur, and FPW devices can operate successfully in liquid environments. Other wave modes that do not involve components of displacement normal to the substrate surface are also operable in both gas and liquid phase. These include Love waves, STW, SH-APM, and LG-APM, LG-SHAPM.

Rayleigh wave SAW devices coated with polymers, metal oxides, composite, and nanostructured thin films and other chemically sensitive materials have been used extensively for chemical vapor detection, for evaluation of interfacial properties such as thin film phase changes and morphology, and for monitoring of the reaction kinetics of chemical and biological reactions. QCM devices have also been applied to characterization of interfacial chemistry in both vapor and liquid environments. In the past two decades, there has been significant research into the application of STW, APM, FPW, and Love waves to liquid based biosensing. The improvements that are the subject of the embodiments of the present invention, while exemplified herein by device embodiments that typically would be implemented using Rayleigh waves, are general in nature and can alternately be applied to device embodiments utilizing any of the aforementioned acoustic wave modes, along with other modes not mentioned, including but not limited to leaky waves and pseudo-SAW.

Due to the sensitivity of surface-launched acoustic wave sensors to changes in many environmental parameters, it has been customary to utilize some sort of reference signal or signals in the sensors or one or more reference device in the sensor systems. This has been accomplished in various ways. For example, differential delay line devices have been used to eliminate variations in electronic signals common to both delay paths, resulting in sensors that have certain performance characteristics that are only sensitive to variations in temperature. Similarly, pressure sensors have been developed that utilize multiple transducer and/or reflector structures with wave propagation at different orientations on the substrate to provide information about temperature simultaneously with information about pressure, allowing for the unambiguous determination of both parameters using a single sensor device. SAW-based chemical vapor sensor systems have historically utilized multiple chemically selective film coated SAW sensor devices in an array configuration. Chemically selective films were chosen for their orthogonality in the chemical domain, or their ability to selectively adsorb or absorb chemical vapors of differing kinds, as well as the vapors of interest. Patterns of vapor responses developed on the multi sensor arrays could then be characterized using pattern recognition techniques. Reference sensors that were hermetically sealed or otherwise protected from exposure to the vapors under test were generally included in the arrays in order to allow for accurate determination of the array response. These arrays were often temperature controlled, either through bulk temperature control of the sensor devices (using under package heating and cooling) or through on-chip heaters incorporated in the sensor devices. These temperature control elements (including on-chip heaters) could be used to thermally ramp sensors and observe the temperature (and thus time) dependent desorption of adsorbed of vapors, providing an additional metric useful for pattern recognition. Prior biosensor devices have generally been used individually or in pairs, where one device serves as a reference device for the pair. In most cases where arrays of sensors have been used in biological and/or chemical sensing, the array has been composed of multiple individual distinct sensor devices along with measurement electronics (one exception being an array chemical/biological sensor introduced several years ago by the inventors of the embodiments of the present invention). Depending on the system configuration, the measurement electronics may be common ("shared" and used sequentially by all sensors in the array), or multi-channel electronics may be used, allowing the simultaneous (or near-simultaneous) measurement of all array elements.

Prior SAW based RFID tags and physical sensors and sensor tags have utilized various coding methods and other diversity techniques to allow identification of individual sensors within multisensor networks. Such sensors have also been accessed primarily via wireless radio frequency (RF) communication techniques. In the past, the ability to incorporate unique sensor identification and the potential wireless operation aspect of these sensors has generally not been exploited for chemical and biological sensing applications in vapors and liquids, with the exception of work done by the inventors in this area. More detail on the related art for physical sensors, SAW RFID tags, and SAW sensor tags is provided below. The embodiments of the current invention relate to improvements that can be utilized for any of these sensing, identification, and combined sensing and identification applications.

SAW RFID Tags:

SAW devices have been used as radio frequency identification device (RFID) tags since the late 1980's and early 1990's. SAW RFID tags are passive responders, wherein an incident RF signal is captured by an antenna attached to the tag, activates the SAW tag, and is re-transmitted as the reflected (S11) response of the SAW device. Traditional single frequency SAW RFID tags consist of a piezoelectric substrate, generally selected to be temperature stable (hence quartz was a common substrate), with a single input/output transducer and a set of reflective taps positioned at various delays on either side of the transducer. The reflective taps are positioned in time "slots" that are separated far enough in time to allow the reflections from any two successive slots to be resolved. The S11 response of a traditional SAW RFID tag consists of a sequence of time domain pulses such that in each successive time slot the existence of a pulse is read as a "1" and the absence of a pulse is read as a "0". If the code is N time slots long, then the number of unique codes is $2^N$. The use of two-sided single acoustic track device configurations allowed the designer to incorporate more time slots then would be possible with a single-sided layout. In addition to placing constraints on the number of possible codes for a given device size, the time extent of each time slot (with guardbands on each side to prevent misidentification of taps) also limits the time extent of each reflecting tap. This limits the number of reflecting strips in each tap, which reduces the possible reflection for each tap. Another factor limits the number of possible taps as well. Since the taps are located in the same acoustic track, if taps close to the input/output transducer reflect SAW energy, that removes SAW energy from the wave propagating further out in the track, which means that there is less to be received and reflected from the taps farther out from the transducer. The result is that the signals reflected from sequential taps are of decreasing strength. This effect can be compensated for somewhat by increasing the number of electrodes in the taps that are further from the transducer, but this can introduce significant intertap reflection problems. Intertap reflections occur when the SAW reflected by one tap reflects off of a tap closer to the transducer and propagates once again away from the transducer, only to be reflected from taps further away in the SAW path. In order to avoid intertap reflection problems and allow the SAW energy to propagate and be reflected by multiple taps, it is necessary to keep the total reflectivity of each tap low. Low tap reflectivity, however, results in high reflection loss. The time domain response of typical SAW RFID tags at 2.45 GHz are generally 55 dB or more with approximately 32 taps [a, b] and can exceed 70 dB for devices with many more tap positions. The smaller the number of reflective taps needed to effect the desired number of codes, the lower the possible insertion loss and vice-versa. Chirped input transducers have been used, in combination with chirped signals, to produce tags with lower loss.

In addition to simple on-off coding involving tap positions, a number of other coding techniques have been applied to SAW RFID tags. Phase shift keying has resulted in a higher signal to noise ratio than simple on-off coding, while advanced techniques such as overlapped pulse position modulation combined with phase offsets and multiple pulses per group have been shown to enable larger codesets with adequate signal levels. All such methods involve binary codes, with SAW electrode weightings of +1 and 0 (taps or reflectors are present or not present at each time increment of interest).

Another method used to avoid intertap reflections and achieve larger codesets is to design devices with multiple parallel acoustic tracks. Input transducers can be connected electrically in series or parallel, with each transducer having a two-sided acoustic track. This reduces the number of reflective taps in each track and allows the designer to use more reflective electrodes in each tap without concern for intertap reflections. However, these techniques also suffer from power division losses in the transducers, and hence cannot substantially reduce insertion loss.

All of the previously discussed SAW RFID tag approaches can be grouped together as reflective delay line techniques. Another type of well-known SAW RFID tag uses a resonator approach instead. This type of device consists of multiple SAW resonators that are connected in parallel via matching networks to a common antenna. These very narrowband resonators are designed to be separate in frequency, with guard bands sufficient to ensure that the frequencies at which the different resonators respond will not overlap over the operating range of the device. Presence or absence of a response at each frequency constitutes a "1" or a "0" in the corresponding (binary) code position. Sensing (for example temperature) can be incorporated in the device by including one or more resonators built on substrates with different characteristics (such as TCD), and monitoring the change in resonance frequency for this resonator measured differentially relative to another reference resonator in the response.

Any of the known SAW RFID tag approaches can be implemented on SAW substrates with properties appropriate for use as sensors. Temperature sensors have been demonstrated, and other sensors are possible using similar techniques. Frequency modulated continuous wave (FMCW) interrogation system have been used commercially for temperature sensors on 128 lithium niobate (as in the commercially available module from Baumer-Ident) with total bandwidths of 40 MHz at 2.45 GHz, and pulse position modulation coding enabling $10^4$ codes. In this system, a rough measurement of temperature is obtained by evaluating gross delay, and a finer temperature measurement is obtained by using the gross measurement to eliminate the phase ambiguity of $2\pi$ and subsequently utilizing phase to calculate temperature with a resolution of $\pm 2°$ C. This approach was extended by Kuypers to achieve accuracies of approximately $\pm 0.1°$ C. A wide range of additional work has been done in the area of passive wireless SAW sensor/tag devices.

Passive Wireless Coded SAW Sensors:

Wireless sensors for physical properties, such as temperature, have been known for about 20 years. In the 1990's, SAW engineers began developing means to use sets of several SAW devices together in wireless systems, with the goal of being able to identify each individual device. In 1999, Alfred Pohl and Leo Reindl published a paper entitled "New Passive Sensors" that discussed, in part, various means for providing individually identifiable devices. Code division multiple access (CDMA), time division multiple access (TDMA), frequency division multiple access (FDMA), and hybrid schemes combining two of these at a time (TCDMA, TFDMA, FCDMA) are mentioned. This paper specifically states that CDMA is not applied for radio sensors due to the near/far effect, and hybrid schemes like time/frequency division are also not applied for radio sensors as well. This work also suggests use of a nonlinear device to generate harmonic content, as a means of attaining additional frequency diversity.

Previously described FDMA passive wireless SAW sensors generally utilized the frequency of a resonator as a measurand, while TDMA sensors used the time delay of a delay line or compressed signal response as the parameter for indicating a measured quantity. Multiple sensors could be used in a single wireless system, provided the techniques of frequency diversity or time diversity were used, i.e. multiple resonators at different frequencies or multiple delay lines with different delays or different differential delays were used. In such systems, it was necessary to design these devices with enough frequency separation or enough time separation that the responses of individual sensors would not overlap even when they experience variations in the sensed parameter(s). This necessarily limited the number of potential sensors dramatically, as both time delay and bandwidth are limited.

In recent years, the inventors have been working with Dr. Donald C. Malocha at the University of Central Florida on development of another type of coded SAW sensor. Initially envisioned as an Orthogonal Frequency Coded (OFC) SAW sensor, these devices would operate passively, responding to an RF interrogation signal with a reflected signal containing the ID code of the sensor and the measurement of the sensed parameter. Original OFC devices utilized a wideband input/output transducer, and frequency coded reflective arrays in a differential delay line configuration to provide both sensing capability and a unique ID code. The inventors have developed various different embodiments in the past few years, incorporating time diversity and frequency coding, and modifying the requirements for utilization of strictly mathematically orthogonal frequency bands. All of these devices benefit from the use of spread spectrum techniques, whereby a wide frequency band is utilized to interrogate the sensor, and correlation of the sensor response is used to extract both the sensor ID and the measured data with additional processing gain providing higher accuracy of delay measurement than would be achievable through single frequency approaches.

In addition to these approaches, Reindl and Benes both demonstrated that the use of chirp-radar-like techniques in SAW sensors can enhance device sensitivity. Reindl utilized a two-tap delay line with a wideband transducer feeding two chirped reflectors, where the reflectors had opposite chirp sense. Compression of the sensor response in the interrogator and evaluating the difference between the upchirp and the downchirp response provided an increase in sensitivity by a factor of 10 to 100. Benes stated that compression of spread spectrum signals in SAW matched filters (as used in radar systems) can be used to discriminate between different sensors operating in the same frequency band (i.e. to code the sensors), and that using chirp interrogation signals (of traditional SAW RFID devices) with time inverse SAW matched filters in the receiver can increase the effective delay of the SAW sensor and enhance measurement resolution (0.1 mK for temperature is cited for lithium niobate sensors). Ostermayer also discussed CDMA coding techniques for multiple sensor systems using SAW devices.

SAW Sensor-Tag Wireless Interface Devices:

Another application for SAW devices is to function as a wireless interface to other passive sensors. Brocato demonstrated that a SAW differential delay line could be used, with a sensor that changes impedance with measured quantity attached electrically in parallel with a reflector in one of the paths, to measure variations in the attached sensor. Several other researchers have also demonstrated similar devices. In one case, operation of a switch was demonstrated. In this example, the devices exhibited a significant amount of self-resonance, and what was observed and measured was the amplitude of the reflective response as it rings down.

Ringing in the electronic circuit and the direct RF reflection complicates the interpretation of the response signal in. Reading of the reflected signal is not possible until the direct reflections have died out.

DSSS SAW Sensor:

Direct sequence spread spectrum (DSSS) codes such as Barker codes are widely used in communication systems. These specific binary phase shift keyed (BPSK) codes are well known to have optimal autocorrelation properties. In 1997, Ostermayer, Pohl, Reindl, and Seifert published the use of 13-bit Barker codes in SAW reflective correlation-based sensors. In this scenario, all sensors in a group have the same code (the Barker code), and the distinction between sensors is provided by using different time delays (time diversity). When a signal that is the time reverse of the impulse response of the sensor is used as an interrogation signal, the sensor responds with a pulse that is narrow in time, and is the correlation of the sensor response and signal. Each sensor responds with a narrow time pulse positioned in a distinct time slot. The uniform, low time sidelobes of the Barker function autocorrelation response make its use in time diverse systems possible, as the response from sensors with different delays will introduce only low levels of cross correlation interference with the autocorrelation peaks of interest at any given delay.

More recently, researchers at the University of Maine have utilized different binary DSSS codes (not Barker codes) to produce a set of 6 sensors for use in a wireless system. This system sends out a coded signal matching one of the sensors. This signal correlates with the sensor of interest, producing an autocorrelation response, while it interacts with other sensors to produce cross-correlation responses. The combined response of all sensors within the field of view of the reader will be returned to the system. Signals interpreted as individual sensor responses (produced when a specific coded signal is sent out to activate a selected sensor) will be influenced by any contributions of cross-correlation between the codes. All of the DSSS coding methods described in prior art utilize binary codes, which consist of +1 and −1 values arranged sequentially according to the selected code. These are easily implemented in SAW devices by using overlapping electrodes of equal lengths, connected to busbars of opposite polarity, with changes in polarity of bits (from + to − or vice versa) generated by flipping the connections of the electrodes from on busbar to the other.

SUMMARY OF THE INVENTION

A problem with current passive wireless coded SAW sensors and sensor-tags is the limited number of sensor codes that will operate simultaneously due to code collision interactions. Frequency diversity, which generally utilizes narrowband responses such as resonators, can produce devices that are truly independent with almost no interference. This approach has been used to produce up to 6 resonant sensors, but production of larger sets within commercially useful spectral bandwidths is precluded by bandwidth limitations and the need for guard-banding. Time diversity can only produce completely non-interacting devices if the time offset between sensors is large, although a single code with good auto-correlation properties (such as a 13-bit Barker code) has been used with time diversity with shorter time slots to produce sets of roughly equivalent size with only moderate interference between devices. Code diversity alone (OFC and related techniques or DSSS) has produced sets of 4 to 6 sensors. The inventors have used a combination of code diversity and time diversity to produce a set of 16 sensors that operate simultaneously in the field of view of a wireless sensor system. Reflective tapped delay line SAW RFID tags and sensors can produce very large sets of codes, but in practice only a couple of devices can operate within the field of view of a reader and be read successfully. All of the coded correlation-based systems in prior art suffer from difficulty related to the interference between sensor responses due to code cross correlations. The DSSS system is one good example. When a DSSS signal is transmitted, it interacts with all sensors in the field of view of the reader, and all the sensors reflect back response signals. The response signal from the sensor of interest is based on the autocorrelation of the DSSS code transmitted, while the response signals from the other sensors are based on the cross-correlations of the DSSS code transmitted with the codes of the other sensors. In a system with ideal codes that do not interact (or are perfectly orthogonal), the cross-correlation responses would not produce code interference problems. However, in the systems developed to date, the codes used have not been ideal, because sets of DSSS codes that have exactly zero cross-correlation between codes for all relative time alignments simply do not exist. Any cross-correlation interactions mean that one DSSS code transmitted will produce not only the desired sensor response, but will also induce non-zero responses from all the other sensors. The size of this interfering response will depend on which sensors are present in the group, how large the cross correlation of the transmitted signal is with each sensor code, and due to near/far signal attenuation, the location of each sensor relative to the transceiver. The interference signal will make the response of the desired sensor look larger or smaller than it really is, depending on whether the interference signal is in or out of phase with the desired signal, an effect that will vary in significance for different transceiver system architectures. This makes interpreting the reflected device responses and calibrating the sensor system difficult, and dependent on the precise sensor group choice and sensor spatial distribution. These limitations apply not just to prior art DSSS wireless sensor systems, but to reflective tapped delay line devices, OFC, and other systems that utilize code diversity in any form, since truly ideal, perfectly non-interacting codes cannot be realized using any of the techniques known to date. Embodiments of the present invention address these issues.

Still other aspects, features and advantages of the present invention are readily apparent from the following detailed description, simply by illustrating a number of exemplary embodiments and implementations, including the best mode contemplated for carrying out the present invention. The present invention also is capable of other and different embodiments, and its several details can be modified in various respects, all without departing from the spirit and scope of the present invention. Accordingly, the drawings and descriptions are to be regarded as illustrative in nature, and not as restrictive.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The present invention will be understood more fully from the detailed description given below and from the accompanying figures and drawings of various embodiments of the invention, which, however, should not be taken to limit the invention to the specific embodiments, but are for explanation and understanding only.

FIG. 2(b) shows a SAW implementation of the same code where the output transducer does band-limit the Barker code, severely degrading code correlation properties.

FIG. 11 shows the auto and cross correlation performance of a set of four codes formed by using a 5-bit Barker code as a primary code and an amplitude weighted set of four 5-bit codes that has been refined to produce zero cross correlation over a small region near the center of the response.

DETAILED DESCRIPTION OF THE INVENTION

Figure 1:
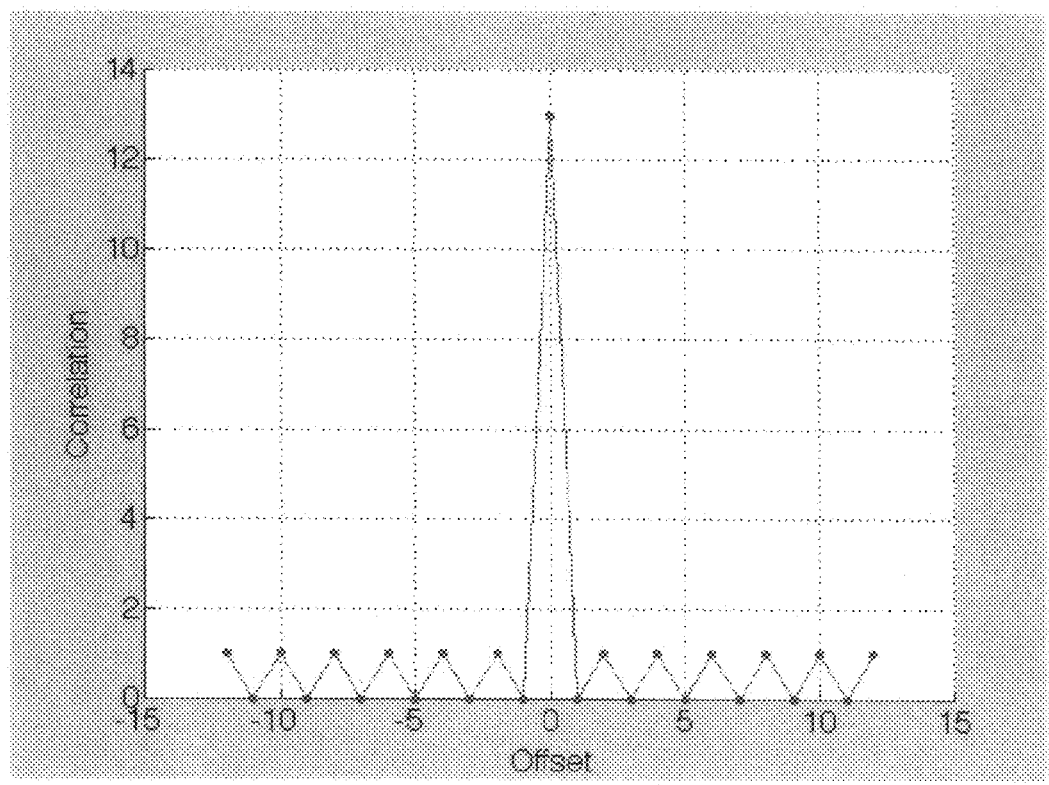
FIG. 1 shows the magnitude of the autocorrelation response of an ideal 13-bit Barker code.

Embodiments of the present invention teach methods for developing sets of individually identifiable SAW sensor tag devices that operate well together, incorporating diversity techniques and codes that have good autocorrelation properties and low cross correlation properties over a desired time range, substantially reducing code collision interference problems.

A first embodiment of the present invention utilizes direct sequence spread spectrum (DSSS) coding combined with both time diversity and frequency diversity to construct sets of individually identifiable sensors or sensor-tags. DSSS coding is alternatively called BPSK (binary phase shift keying) or binary sequence coding. In this technique, a code consists of N bits, each taking on the value of either +1 or −1. The time length of the bit determines the bandwidth (BW) of the code in the frequency domain (the shorter a bit is in time, the wider the BW and vice versa). The SAW implementation of a DSSS code utilizes at least two SAW transducers, generally one to generate the DSSS code and another that receives the SAW launched by the DSSS transducer. [Alternate implementations can utilize one transducer and one or more reflectors.] Of course, being reciprocal devices, the designation of one transducer as an "input" transducer and the second as an "output" transducer is arbitrary, as they are interchangeable. In the simplest form, a DSSS coded SAW device consists of an input transducer containing the DSSS code, and an output transducer that bandlimits the frequency response of the DSSS code. The DSSS transducer consists of interdigitated electrodes connected to one of two bus bars. The specific electrode configuration can be any of a wide range of known configurations, including non-split electrodes, split electrodes, three electrodes per wavelength, SPUDT, and other configurations. One embodiment of the transducer utilizes split electrodes, wherein two electrodes are connected to bus bar #1, and the next two electrodes are connected to bus bar #2, a pattern that repeats for the entire length of one bit. At the end of a bit, the pattern either repeats for another bit, or switches polarity, so that the electrodes that were connected to bus bar #1 are now connected to bus bar #2, and vice versa. Continuity of the pattern from bit to bit indicates that the code has sequential bits of the same polarity, while switching connections as described indicates that the bit sequence has undergone a polarity transition, from +1 to −1, or from −1 to +1. Similar polarity changes can be effected in alternate electrode patterns in a similar fashion.

BW Limitations from DSSS Code:

As mentioned previously, the length in time of each bit of the DSSS code determines the null-to-null bandwidth of the code spectrum in the frequency domain. The output transducer in the SAW device may band-limit the frequency response; if the output transducer BW is narrower than the code BW this band-limiting will in effect change the coding of the device and alter its performance in a system.

Figure 2:
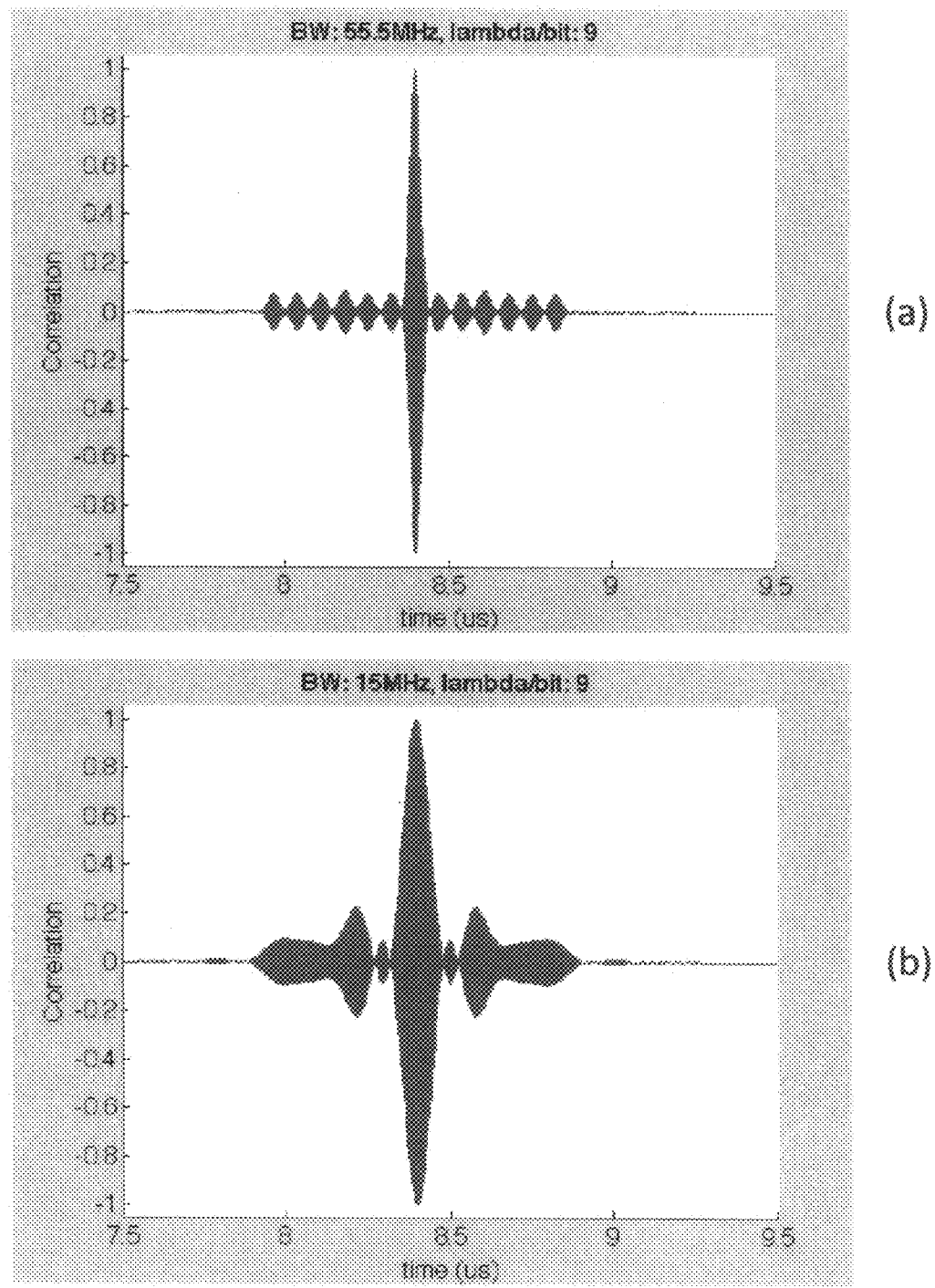
FIG. 2 (a) is an idealized autocorrelation response for the SAW implementation of a 13-bit Barker code, when the output transducer does not significantly band-limit the Barker code spectrum.

Barker Code Example:

One example is the 13-bit Barker code. There is only one known Barker code with 13 bits, and it has desirable autocorrelation properties—namely the autocorrelation peak has an amplitude of 13, and the time sidelobes have a magnitude that alternates between 0 and 1, as shown in FIG. 1. Since the sidelobes result from the time-shifted multiplication and integration of the sequence with itself, the behavior exhibited is the best possible behavior attainable with a biphase modulated signal. Implementation of a Barker code in a SAW device, however, is influenced by the characteristics of how the device is built. Consider a simple SAW device with a 13-bit Barker coded input transducer and an uncoded output transducer that functions as a bandpass filter to band-limit the frequency response of the Barker code. The Barker coded transducer will be implemented using bits that are a specific number of acoustic wavelengths long (at the operating center frequency of the device). The longer these bits are in time, the narrower the frequency response of the Barker code is, and thus the less it will be band-limited by an output transducer of a set bandwidth. (Bit length also impacts overall sensor response length, which influences implementation of time diversity—more short responses can fit into a given overall time length). For a set bit length in time, the narrower the output transducer in frequency, the more the Barker code spectrum is band-limited, which effectively modifies the code and its correlation properties. For example, FIG. 2 shows two plots of the idealized autocorrelation response of a SAW device with an input 13-bit Barker coded transducer with bits that are $9\lambda$ long, and an uncoded output transducer. In FIG. 2(a), the output transducer has a wide bandwidth of 55.5 MHz, so the spectrum of the Barker code is not band-limited much and the correlation response is nearly ideal (compare to FIG. 1). In FIG. 2(b), the output transducer is only 15 MHz wide, and as a result of the band-limiting of the Barker code spectrum, the autocorrelation response is severely degraded. Thus, device design requires careful tradeoffs between DSSS code bit length, output transducer bandwidth, overall sensor response time length, and time diversity and frequency diversity requirements of the system.

Figure 3:
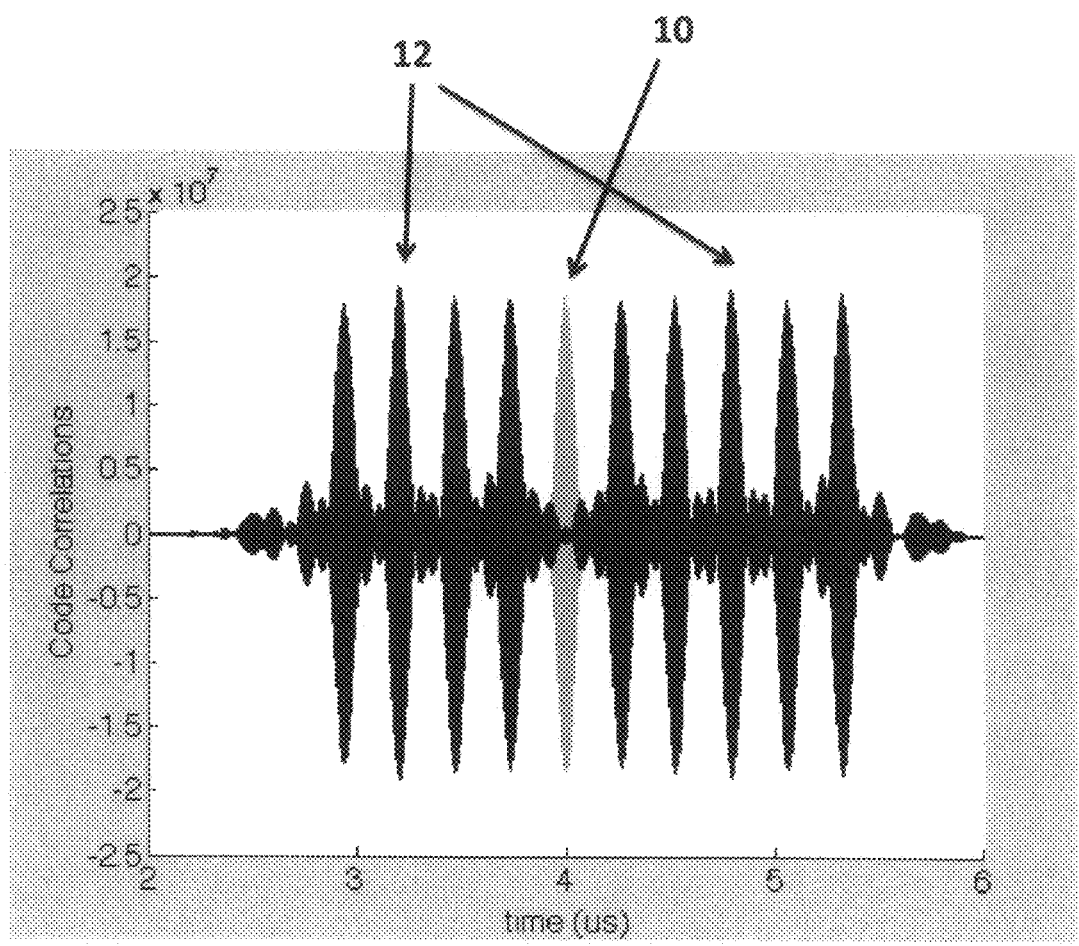
FIG. 3 shows the simulated correlation performance of a set of 100 time and frequency diverse Barker coded SAW sensors. The light central peak is the autocorrelation of one sensor, while the 9 black peaks are the cross correlation of the selected sensor with the other 99 in the set.

The inventors utilized a 13-bit Barker code, with both time diversity and frequency diversity, to implement a set of 100 individually identifiable sensors and sensor-tags. Note that in this case we do not use the term "individually coded" because the code in each device is the same. Instead, we utilize the good properties of the autocorrelation function of the Barker code to enable time diversity, and use frequency diversity to augment the set size further. FIG. 3 shows the correlation response of this set of sensors. The autocorrelation response 10 of one selected sensor is shown, along with the cross correlation 12 of this sensor with the other 99 devices in the set.

In order to determine appropriate sensor design guidelines, it is necessary to consider the system architecture of the wireless reader system that will be used to interrogate the devices. While embodiments of the present invention, using both time and frequency diversity in connection with DSSS codes with specific properties (including Barker codes and others discussed below), can be used with a range of reader types, one embodiment for the reader is a correlation-based spread spectrum differential delay measurement system. In this system, a repetitive broadband noise-like signal (for example a pseudo-noise (PN) code) is transmitted to activate all of the sensors in the field of view of the reader, and the combined signal reflected from the sensor(s) is received by the transceiver. Toggling of the transmit and receive signals, so that the transmit signal is off when the receiver antenna is on, and vice-versa, is desirable to avoid large crosstalk signals that would occur with continuous transmit and receive operation. In addition to being sent to the sensor(s), the transmitted signal is passed through a set of at least two reference filters, designed as matched filters for the sensor responses. Thus, if the sensor has two acoustic paths at different frequencies, there will be two filters with different frequencies in the reference path to correlate with the responses from the respective sensor acoustic path. If the sensor devices contain codes, the reference filters will likewise contain the same codes. An arbitrary number of acoustic tracks can be implemented on the sensor (or sensors), and a matching set of reference path filters will be needed to read and interpret the responses of this set of sensors. The reference filters can be implemented in hardware or as a software radio, and can be used to interpret the combined response of a set of wireless sensors, to read and obtain identification and measurement data from each sensor. A software implementation of the reference filter(s) is particularly advantageous when time diversity techniques are being used (along with code and other diversity techniques), as the received composite response signal from the set of sensors can be digitized, and then digitally "windowed" in time to compare the responses occurring in selected time slots (references to the time at which the interrogation signal was transmitted) with digital representations of each reference matched filter. Digitization of the received sensor signal can be performed at RF, or at a lower sampling rate using baseband or near-baseband sampling techniques. Amplitude levels, and ratios of these levels, from different acoustic tracks and sensors can be useful in making specific measurements, as can other sensor device performance parameters such as correlation peak delays, differences between such peaks, along with other system parameters.

This system performs an averaging process over multiple PN code interrogation sequences, increasing signal to noise ratio and pulling low spread spectrum sensor signals out of the system noise. When implemented as a software radio, the received combined signal is sampled (either at RF or using subsampling), accumulated, and then correlated with the reference response appropriate for each sensor. Data post-processing enables extraction of the identification, response, and distance from the reader of each sensor.

This reader system utilizes the correlation properties of the codes to identify sensor devices with specific codes, and the time and frequency diversity as well to identify and read specific sensors. As with any other wireless SAW sensor system, if the cross correlations of the desired sensor response with all other sensor responses are zero, there would be no ambiguity in sensor identification and no effect of code interactions on sensor accuracy and calibration. In reality, though, it is not possible to construct codes that have no interaction with each other, provided the codes operate in the same time and frequency ranges. What is necessary for good system performance is to have codes with good autocorrelation performance (low sidelobes relative to the peak in the autocorrelation response); and that the cross correlations of each sensor code with other codes is zero at the peak of the autocorrelation function (or the center of the cross correlation responses); and preferably that the cross correlations of each sensor code with other codes is zero or very small over the entire main peak of the autocorrelation function, and a small region outside the main peak to allow for variation in time of the different sensor responses in an asynchronous system and changes in response times due to variations in sensed parameters. Random placement of sensors will introduce random time offsets between the responses due to the RF propagation delay of the signals, and changes in sensor temperature and other sensed parameters can also change the RF signal delay.

Figure 4:
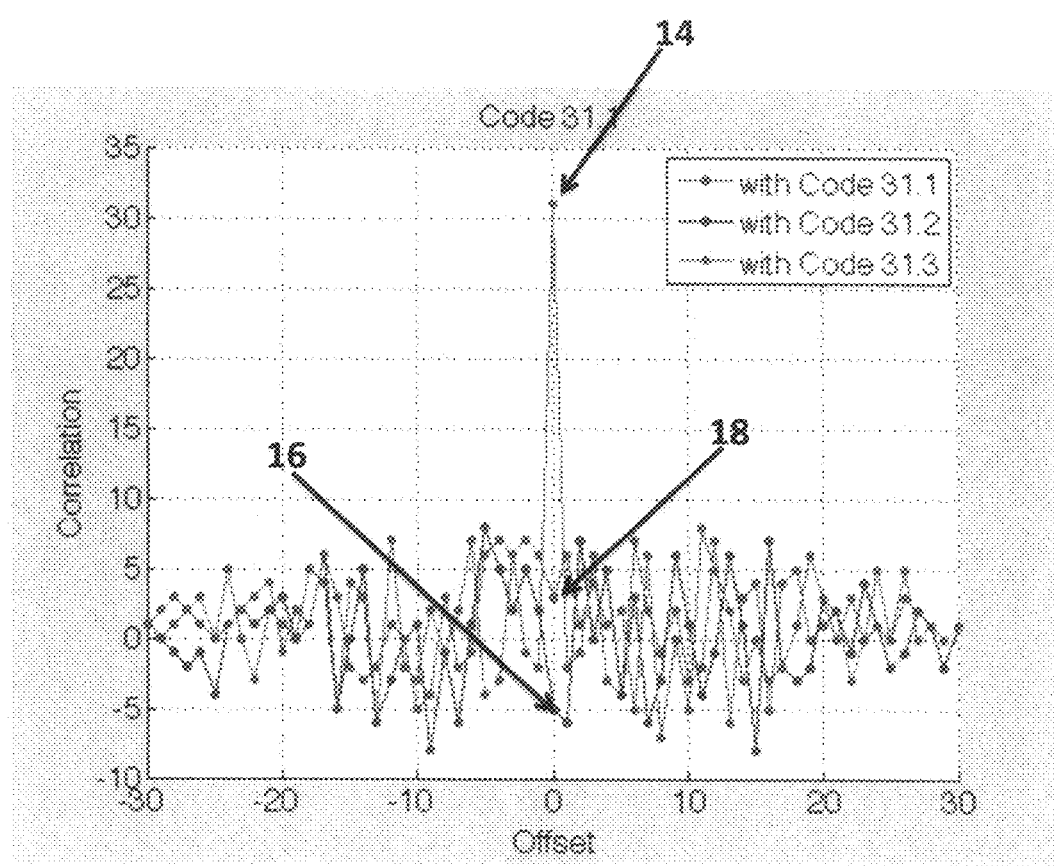
FIG. 4 shows the cross correlation performance of a set of three 31-bit binary DSSS "Gold" codes.

Gold Codes:

One family of conventional binary DSSS codes with good cross correlation properties commonly use is the well known "Gold" code family. FIG. 4 shows the cross correlations of three 31-bit Gold codes selected for good cross correlation performance. Note that at the peak 14 of the autocorrelation of code 31.1, the cross correlation 16 with code 31.2 has a value of −5 while the cross correlation 18 with code 31.3 is 3. This level of cross correlation is large enough that a correlation-based receiver will exhibit errors of up to 35% or more in the amplitude of each sensor response due to contributions from the other two sensors. This occurs with only three sensors present, and is clearly an unacceptably large level of error. While data post-processing can correct for some inter-sensor interference, it is not possible to correct for this high level, and thus sensors utilizing these Gold codes are not well suited for use in an asynchronous passive multisensor system.

Code Selection for Zero Cross Correlation at the Center of the Cross Correlation Response:

Forcing the cross correlations of two or more codes to be zero at the center of the cross correlation response can be accomplished in biphase modulated (BPSK) codes by proper code selection. Computer aided code generation and evaluation algorithms can evaluate all possible binary codes of a given length, first evaluating the codes individually to select those with good autocorrelation properties, and subsequently considering the cross correlation performance of all possible pairs of codes (made up of codes with good autocorrelation performance) to generate pairs of codes that cross correlation to zero at the center of the response. Pairs of codes that have cross correlation responses that remain low in the region near the center can also be selected, with the lowest possible response levels being 0 alternating with ±1.

With traditional DSSS codes, the signal is a series of bits with values of +1 and −1. With two DSSS codes of length N bits, the cross correlation function has length (2N−1) bits. The cross correlation calculation multiplies the response levels of the two codes at each bit and sums these multiplied values (which can also be only +1 or −1). When two different codes of the same length (N) are exactly aligned, the sum of the products of the two codes produces the value of the cross correlation at the autocorrelation peak. This can only be zero if N is even, since this allows for an equal number of +1 and −1 values to cancel. For odd N, the minimum cross correlation value at this central point is 1. Since the autocorrelation peak has size N, the best cross to auto correlation ratio is 1/N for odd N and 0 for even N. Clearly 0 provides a lower level of interaction. "Good" codes can be selected for which each sequential bit away from the center causes the cross correlation to increase or decrease by 1. This produces a branching type structure, where the best response has 0 at the center, 1 or −1 one bit away, then 0, then 1 or −1, etc. Thus, ordinary DSSS codes have a fundamental limit for the cross correlation function amplitude proportional to 1/N. If codes can be designed to alternate between +1, 0, and −1, the integrated interaction across the main autocorrelation peak will be zero, reducing the code cross correlation interference.

Figure 5:
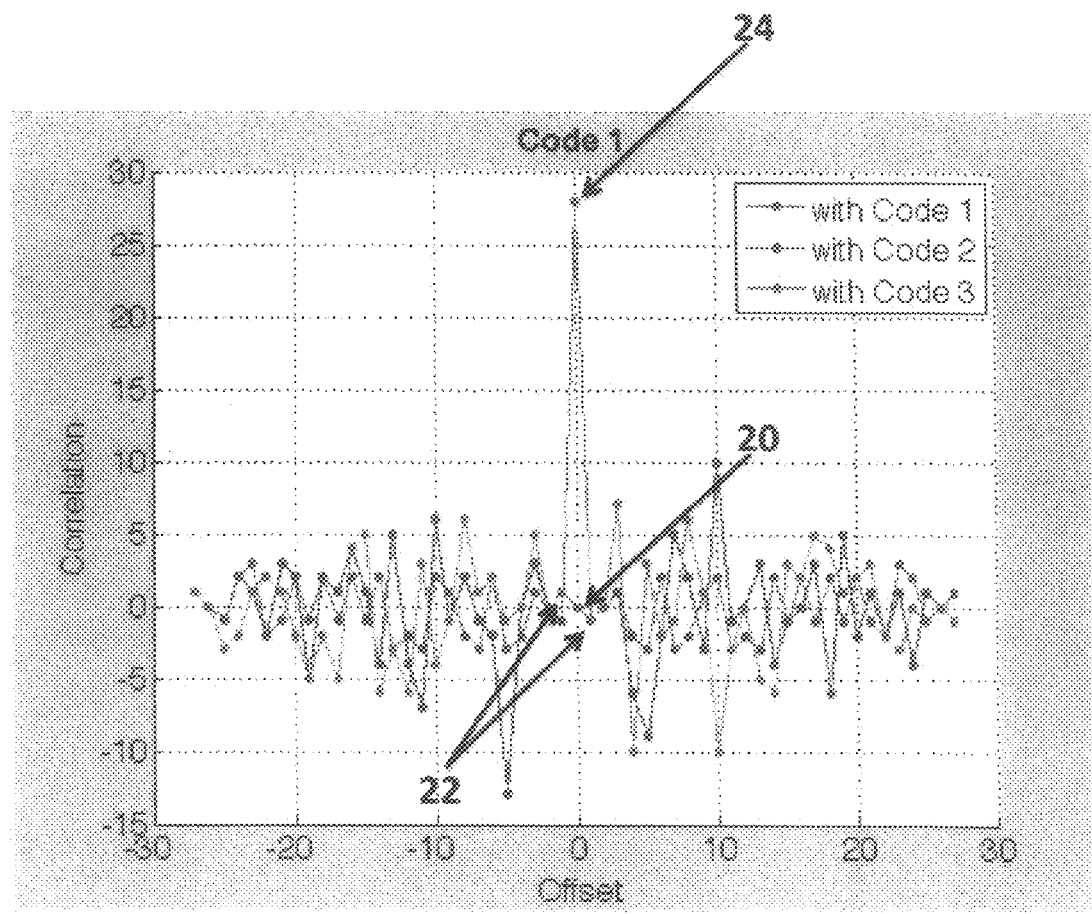
FIG. 5 shows the cross correlation performance of a set of three 28-bit binary DSSS codes designed according to the present invention to have zero cross correlation at the center of the response.

FIG. 5 shows the correlation responses for three 28-bit binary DSSS codes selected for zero cross correlation at the center 20 and cross correlations 22 that stay at or below a magnitude of 1 over two bit intervals on either side of the center. The autocorrelation response peak is 24. Proper code selection can also produce BPSK codes that produce cross correlations that integrate over a specified timeframe to a value of zero, which can also improve codeset performance. Measurement of this set of three codes in a correlation-based receiver with asynchronous sensor operation results in errors in individual sensor reading of up to 7.5%, a substantial improvement over prior Gold codes, but still not ideal.

Amplitude Weighted Codes:

Forcing the cross correlations to be zero at each time sample over an extended range cannot be accomplished in a BPSK code. Embodiments of the present invention address this problem by introducing weighting to the BPSK signal to produce a time domain amplitude modulated BPSK code that can force the code cross correlation functions to be zero across the desired time interval. Standard DSSS coded use weights of +1 or −1 for each bit as described above. Amplitude weighting these bits, i.e. allowing bit values between these limits (in an analog fashion, or in fixed increments of 0.1 or another selected value) provides the flexibility needed to construct codes that produce zero cross correlation over the main autocorrelation peak time range, and a prescribed time range outside of this range. These codes will have zero or near zero interactions, allowing use in wireless sensor systems without significant interference. Thus, amplitude weighting of the DSSS code to force cross correlations to be zero over a range of times covering the main autocorrelation response of each sensor, and a small range around that region to allow for variations in response with temperature and with changes in the sensed parameter(s), provides significant advantages over prior art.

Figure 6:
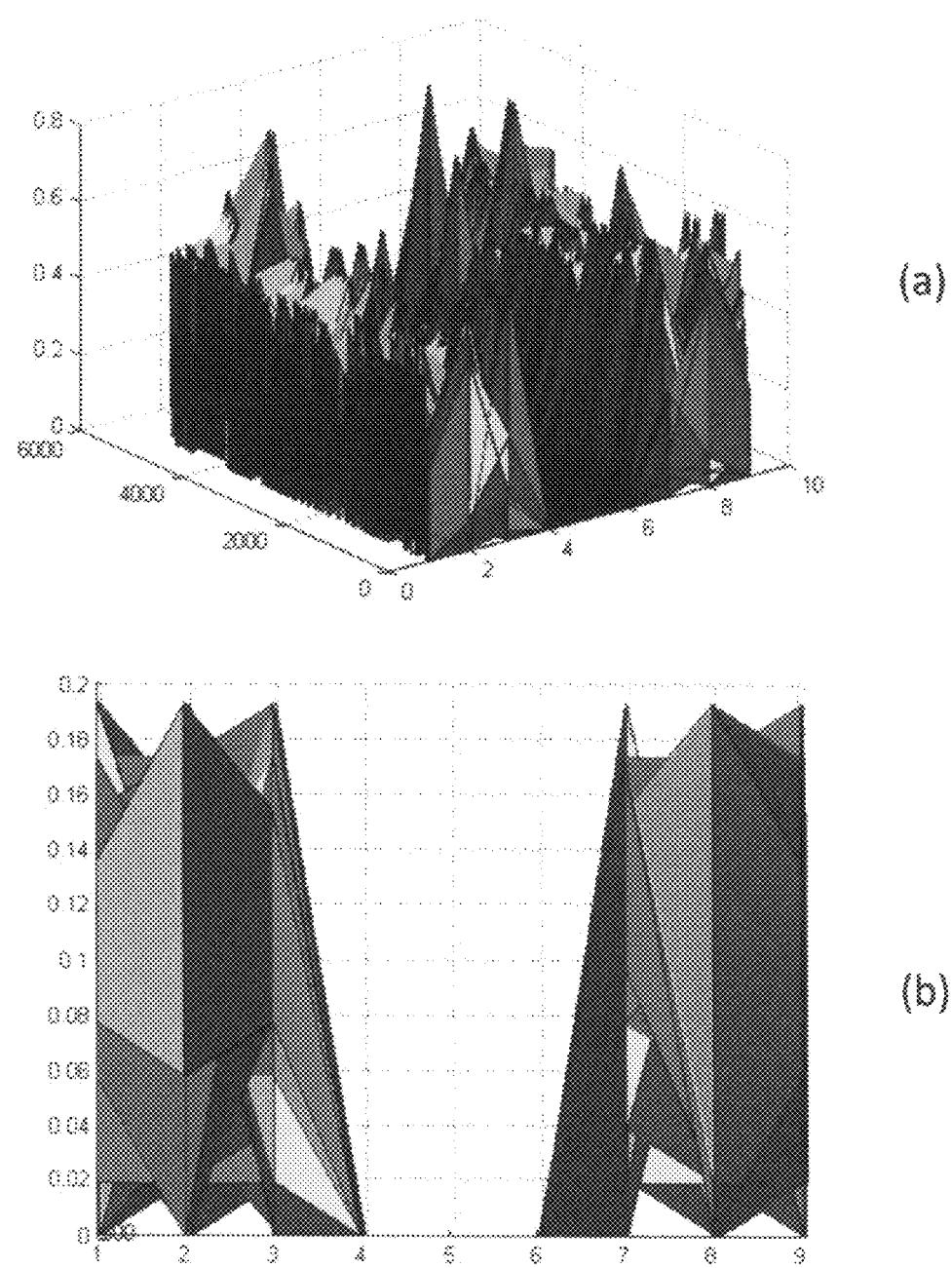
FIG. 6(a) shows a 3-dimensional view of the center 9 bits of the cross correlation responses of a set of 4700, 13-bit amplitude weighted spread spectrum codes.
FIG. 6(b) shows a 2-D view of a subset of the data in FIG. 6(a). Note that all cross correlations remain below a value of 0.2*13=2.6 over a 9 bit range; selected pairs are significantly lower.
Figure 7:
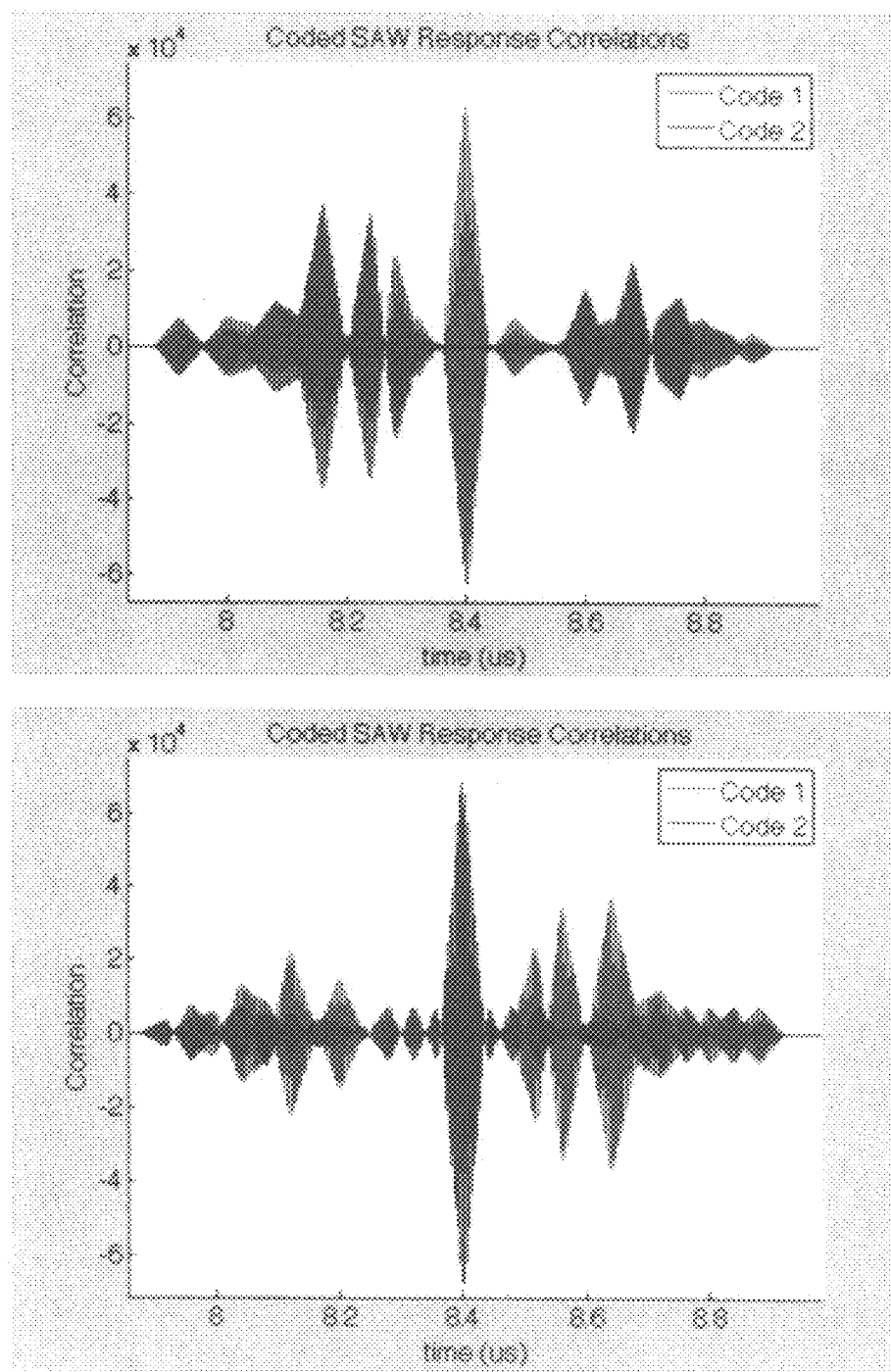
FIG. 7 shows the auto and cross correlations of the SAW implementation of two weighted spread spectrum codes designed to have zero cross correlations over an extended range around the response center.

FIG. 6(a) shows a 3-dimensional view of the center 9 bits of the cross correlation responses of a set of 4700, 13-bit amplitude weighted spread spectrum codes. FIG. 6(b) shows a 2-D view of a subset of the data in FIG. 6(a). Note that all cross correlations remain below a value of 0.2*13=2.6 over a 9 bit range; selected pairs are significantly lower. FIG. 7 shows the auto and cross correlations of the SAW implementation of two weighted spread spectrum codes designed to have zero cross correlations over an extended range around the response center. Measurement of sensors incorporating these codes using a correlation based receiver exhibits reduced errors that are roughly an order of magnitude lower than for binary DSSS codes with zero cross correlation at the center of the response.

Chirped SAW Elements:

In addition to the coding techniques and other diversity techniques described above, embodiments of the invention also incorporate the use of chirp SAW elements with different chirp slopes as an added dimension of diversity. While chirp slope has previously been used to identify individual sensors, it has not previously been combined with the other diversity techniques as in embodiments of the present invention. A group of 32 individually identifiable sensors was developed using a combination of time diversity, frequency diversity, and two distinct (and opposite) chirp slopes.

Figure 8:
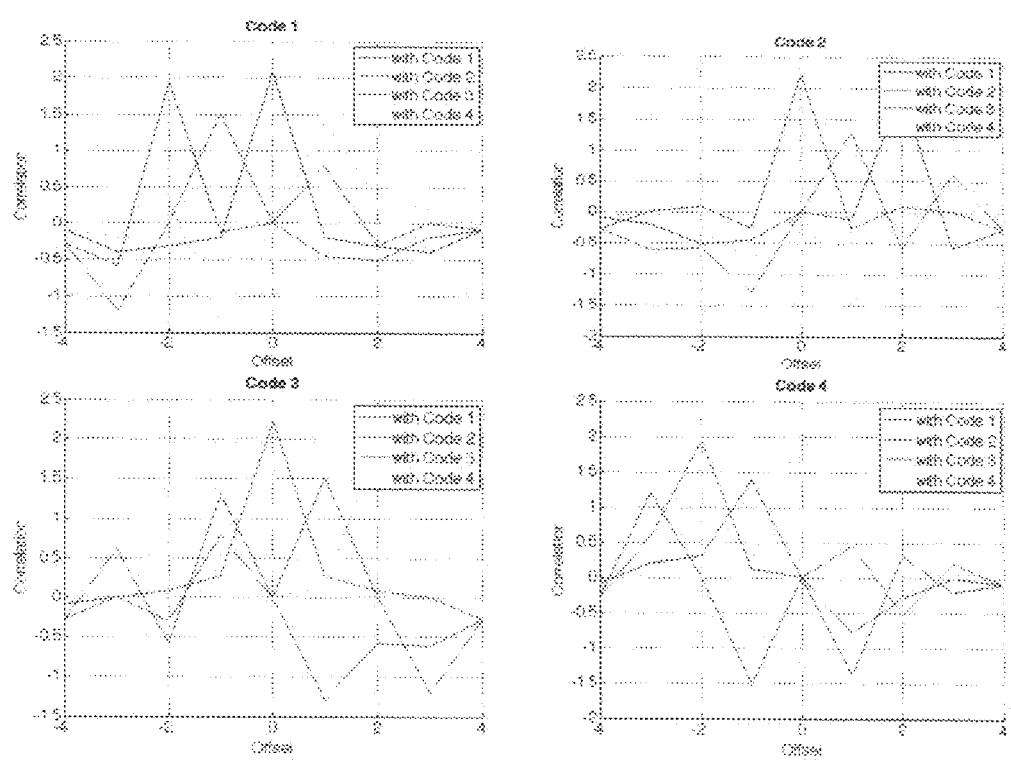
FIG. 8 shows the cross correlation of a set of four 5-bit codes designed to have zero cross correlation at the response center.

Fractal-Like Code Construction:

Another embodiment of the present invention involves construction of a set of preferred codes using a process whereby codes, a "primary" code and a set of "secondary" codes, are used to construct a set of codes with improved cross correlation performance. The primary code is selected to have desirable autocorrelation properties. A set of secondary codes is selected that has desirable cross correlation properties, generally including having zero cross correlation at the center of the response, and preferably over a small time range about the center point. To construct each "fractal" code, the primary code is concatenated with itself a number of times equal to the number of bits in the secondary code, with each repetition of the primary code amplitude weighted based on the amplitude of the corresponding secondary code bit. FIG. 8 shows the cross correlation responses of a set of four 5-bit amplitude weighted spread spectrum codes with zero cross correlation at the center, which will be utilized as the secondary codes for fractal code formation. Each plot shows the autocorrelation of one code, and the cross correlation of that code with the other three codes in the set. Note that while the cross correlation responses are zero at the center point, the cross correlation performance away from the center is not particularly outstanding.

Figure 9:
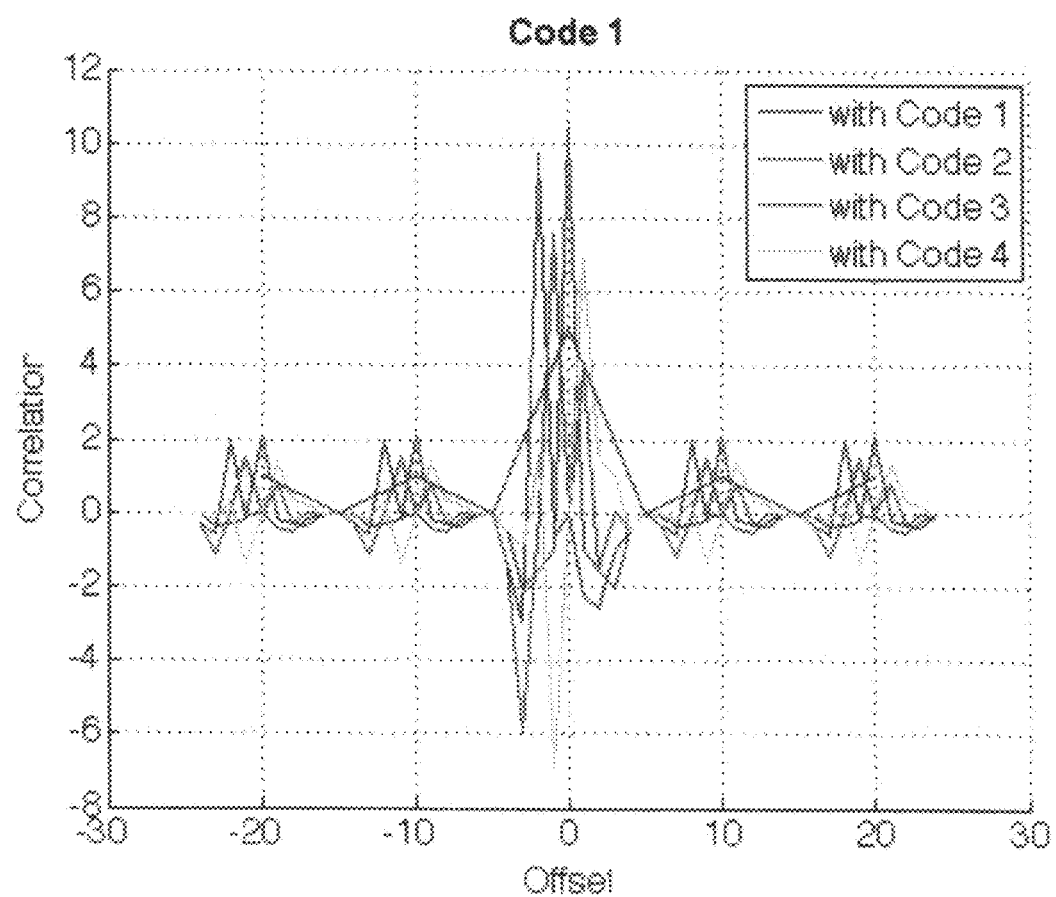
FIG. 9 shows the cross correlation performance of the set of four codes constructed when the codes shown in FIG. 8 were used to fractal into a 5-bit Barker code.
Figure 10:
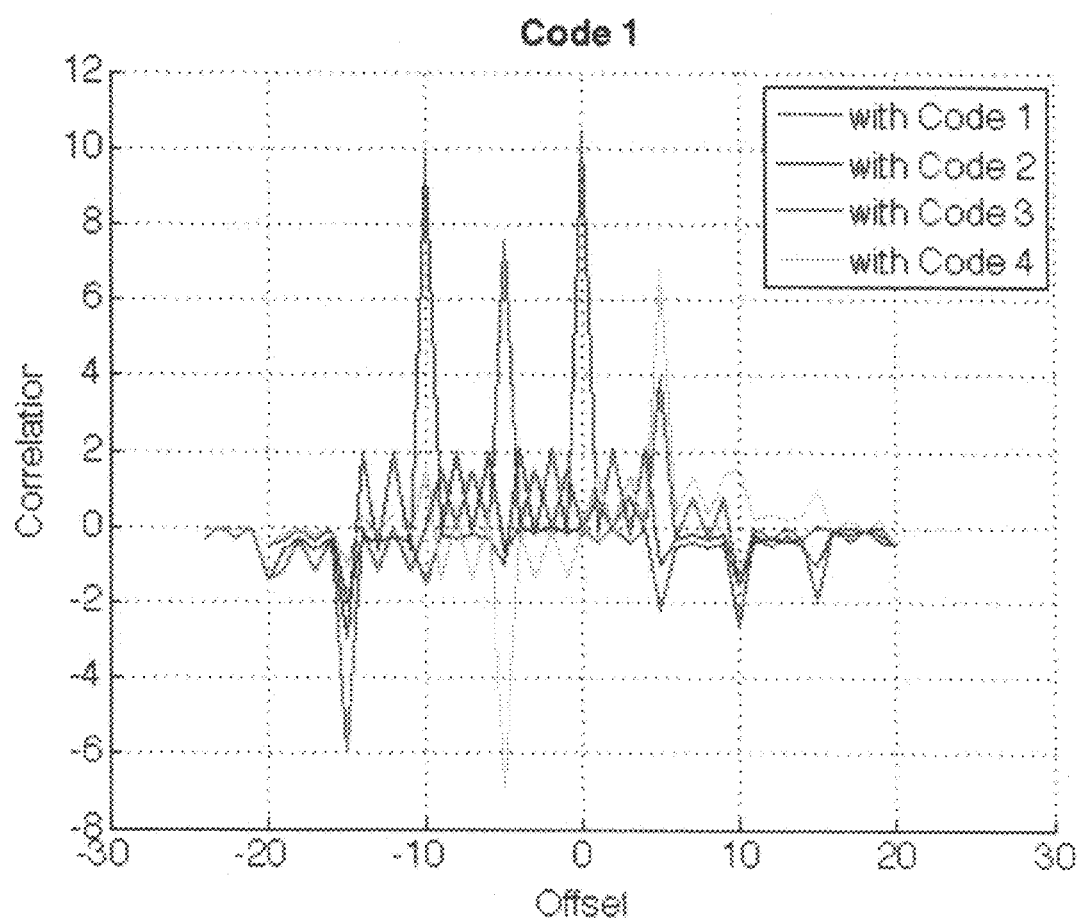
FIG. 10 shows the cross correlation performance of the set of four codes constructed when a 5-bit Barker code was used to fractal into the codes shown in FIG. 8.

The 5-bit barker code [1 1 1 −1 1] exhibits a mathematical autocorrelation of [1 0 1 0 5 0 1 0 1], which is good autocorrelation performance. Since the secondary code used governs the amplitude of the repeated primary code, it is important to use a set of secondary codes with good cross correlation properties, with a primary with good autocorrelation. By way of example, if the set of four code with cross correlation performance shown in FIG. 8 were used to fractal into a 5-bit Barker code, the cross correlations of the resulting set of four codes would be that shown in FIG. 9. Note that for the resulting set of codes, the cross correlations of code 1 with codes 2, 3, and 4 have peaks nearly as large as the autocorrelation peak for code 1 and located very close in time to said autocorrelation peak. Thus, this set of sensors would exhibit very poor performance when used together in a multisensor system. However, if the four codes from FIG. 8 are instead used as secondary codes, with the 5-bit Barker used as a primary code, the resulting codes have cross correlation performance shown in FIG. 10. Note that the largest cross correlation peaks have now been shifted out in time, 5 bit lengths away from the autocorrelation peak. This set of codes would have significantly improved performance over those of FIG. 9.

Figure 12:
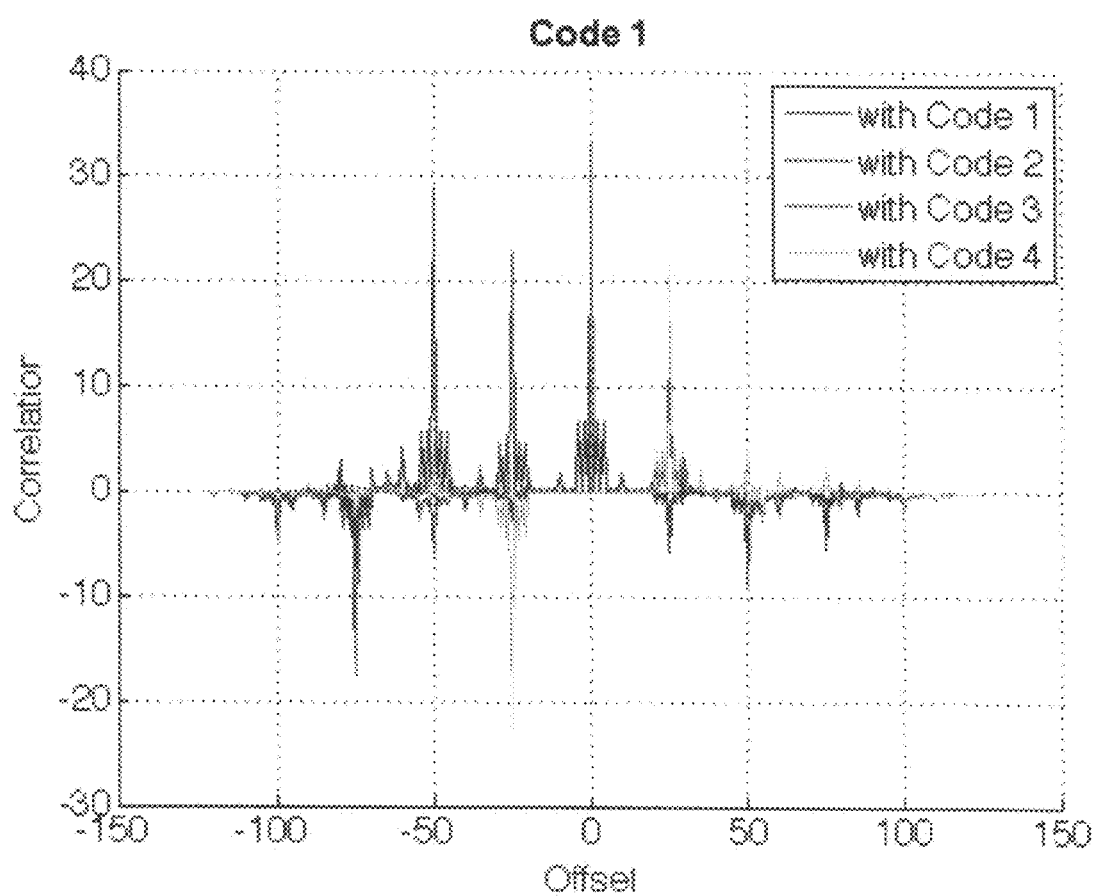
FIG. 12 shows the autocorrelation of one 125-bit code and the cross correlation between that code and three others, when all four codes were produced by fractal repeating (in a weighted fashion) a 5-bit Barker code (primary) into the four 25-bit codes corresponding to the correlation performance shown in FIG. 11. This set of codes has zero cross correlation over a 50-bit wide range around the center.
Figure 13:
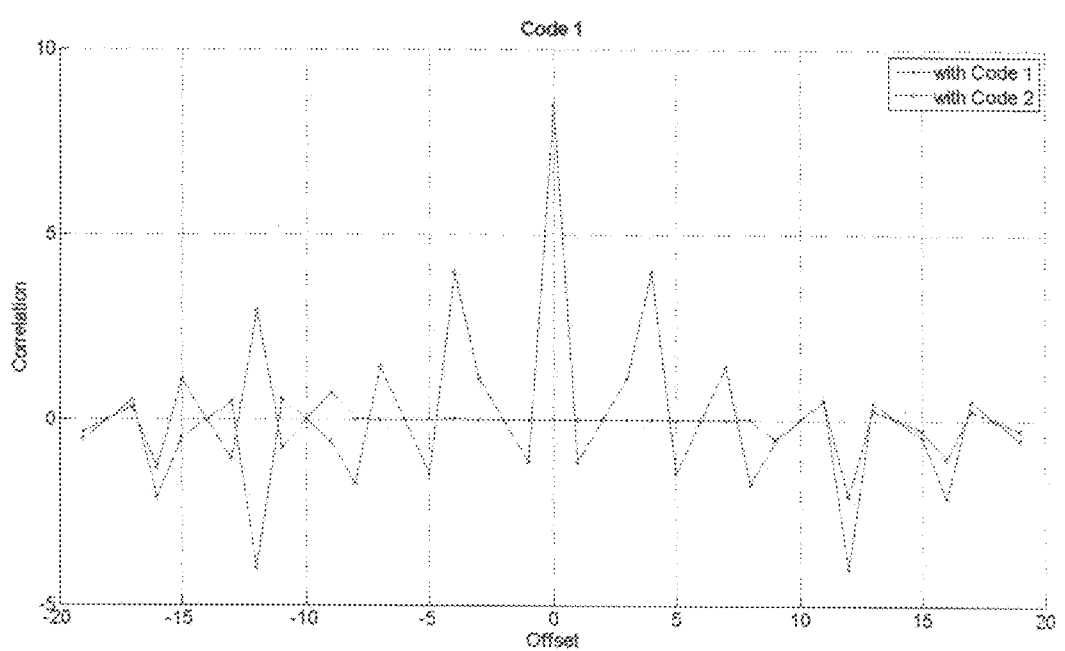
FIG. 13 shows the cross correlation of two 20-bit codes, produced by fractal code composition, that have zero cross correlation over the center 17 bits of the 39-bit long cross correlation response.

This process of constructing codes in a "fractal" manner can be repeated more than once, and can be performed using binary or amplitude weighted spread spectrum codes, or a combination of the two. FIG. 11 shows the auto and cross correlation performance of a set of four codes formed by using a 5-bit Barker code as a primary code and an amplitude weighted set of four 5-bit codes that has been refined to produce zero cross correlation over a small region near the center of the response. Note that the cross correlation of this set of four 5-bit fractal codes is now identically zero over a broad, 9-bit wide region across the center of the response. This set of codes exhibits superior code collision avoidance, even when used in sensors subject to widely varying environmental conditions and placed at random RF delays (within a broad range). This is one key improvement of embodiments of the present invention over prior art. The process of fractal code construction can be repeated to produce longer codes that also exhibit outstanding performance. Another embodiment of the present fractal code invention is provided in FIG. 12, which shows the autocorrelation of one 125-bit code and the cross correlation between that code and three others, when all four codes were produced by fractal repeating (in a weighted fashion) a 5-bit Barker code (primary) into the four 25-bit codes corresponding to the correlation performance shown in FIG. 11. This set of codes has zero cross correlation over a 50-bit wide range around the center! This outstanding performance can also be achieved for short codes, one example of which is provided in FIG. 13. This shows the cross correlation of two 20-bit codes, produced by fractal code composition, that have zero cross correlation over the center 17 bits of the 39-bit long cross correlation response! Such exceptional performance can produce sets of codes that operate well in asynchronous CDMA systems, and require only minimal data post-processing to accurately extract sensor identification, measurement(s), and distance from the wireless reader for a set of sensors at random locations and subject to random environmental conditions or measurands (temperature, etc.). The inventors have used the advanced coding techniques taught herein, in combination with time and frequency diversity, to implement a set of 32 individually identifiable temperature sensors, and larger sets are possible. Codes can be constructed that are symmetric in time, allowing convenient implementation in SAW reflector structures.

The application of the code construction techniques taught herein has focused on producing coded SAW devices with desirable performance. However, the utility of these codes would extend to any multi-user communication system that would benefit from improved code independence and reduction in code collision. CDMA wireless communication systems, digital and analog and mixed signal, radar, and other applications could potentially benefit from application of the techniques of embodiments of the present invention. The focus on SAW implementations of these codes is not intended to be restrictive, as other applications would benefit from these techniques as well.

Physical Embodiments of DSSS Coded SAW Devices:

Practical implementation of DSSS codes in SAW devices places constraints on device design. For a given piezoelectric substrate, the number of electrodes that can be used in a standard, in-line transducer is limited by practical considerations. For example, for YZ lithium niobate, transducers that exceed 150 wavelengths long can suffer from multiple reflections—where the acoustic wave launched at the beginning of the transducer is reflected from electrodes further on in the transducer, introducing interfering signals. This condition is commonly referred to as "overcoupling".

To avoid overcoupling, designers maintain transducer lengths under certain guidelines. For DSSS codes, this sets a limit on the number of bits and bit length combination that can be implemented in a single acoustic track. For instance, again on YZ lithium niobate, a 16-bit code can only have about 9$\lambda$/bit, while a 28-bit code can only have about 5$\lambda$/bit to remain within design guidelines. However, these constraints have implications on the bandwidths that can be quite restrictive, since the shorter the code bits the wider the code spectrum. Use of longer bits to produce narrower code spectra is beneficial for system reasons (antenna efficiency and increased frequency diversity), but is normally precluded by the excessive length of in-line transducers as bit length increases. For example, a code with 5λ/bit at 250 MHZ would have a BW of 100 MHZ.

Embodiments of the present invention improve over prior art by utilizing slanted, tapered, or stepped tapered transducer structures to implement DSSS codes with long bits by distributing the bits laterally across multiple parallel acoustic tracks on the sensor device. For example, a 28-bit DSSS code with 5λ/bit at 250 MHz would be 140λ long with a BW of 100 MHz. Increasing bit length to 20λ/bit would reduce the BW to 25 MHz, but would increase transducer length to 560λ—far too long to implement in-line. Breaking the coded into four channels, each with 7 bits, produces acoustic tracks with 140λ long transducers, but maintains the reduced BW of 25 MHz.

A sample of some of these device embodiments is shown in the attached sketches. This set is illustrative in nature, and is by no means exhaustive.

Figure 14:
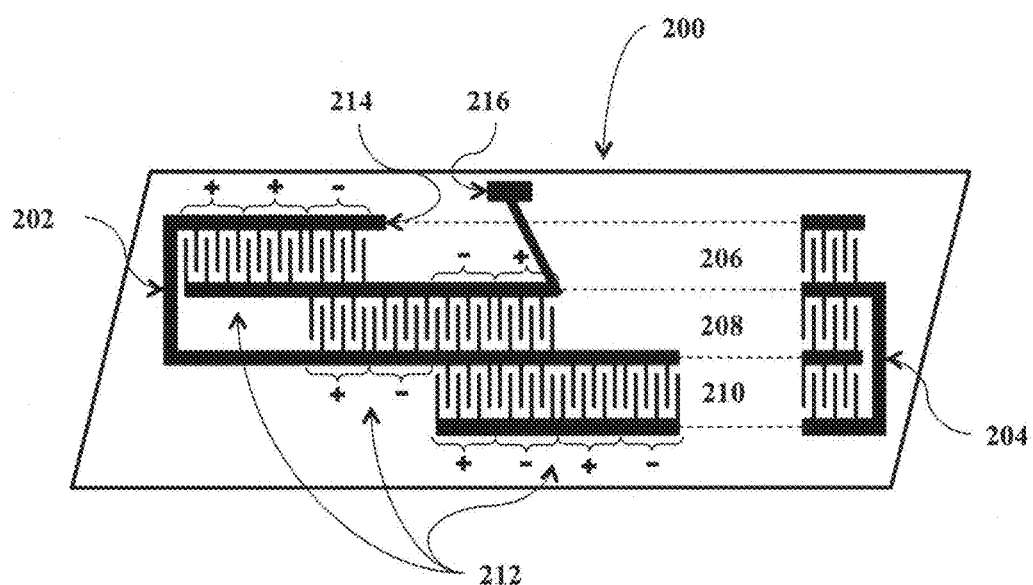
FIG. 14 shows one embodiment of the present invention, wherein the DSSS coded transducer has been implemented in three acoustic tracks, with matching segments in the output transducer.

FIG. 14 shows one embodiment of the present invention. Device 200 comprises a piezoelectric substrate (also called a die) on which are formed at least two SAW elements, at least one of which is a transducer. In FIG. 14, the left SAW element 202 is a transducer, which serves to receive an exciting signal from an input/output antenna that is not shown. Alternatively, these devices can operated in a wired configuration without an antenna. Transducer 202 converts the input electrical signal into a surface acoustic wave signal, that propagates outward to the right (at a minimum) in three acoustic tracks 206, 208, and 210 along the surface of the die. The acoustic wave is received by the corresponding sub-transducers of SAW transducer 204. This generates an output response, which can be reflected back to the transceiver wirelessly through an antenna, or in wired form. The two transducers 202 and 204 can be fed in parallel through a single antenna or wired connection. Transducer 202 is constructed to keep the number of electrodes in each individual acoustic channel under the maximum limit appropriate for the piezoelectric substrate of interest to avoid overcoupling. Each track of transducer 202 contains multiple spread spectrum code bits 212, each of which is shown with a "+" or "−" in FIG. 14. The bits shown in this example are equal amplitude, as shown by the uniform overlap of electrodes for all bits. Amplitude weighted codes, by comparison, could be implemented using unequal electrode overlap lengths (apodization), or using other weighting methods such as withdrawal weighting or electrode width weighting, among others.

Figure 15:
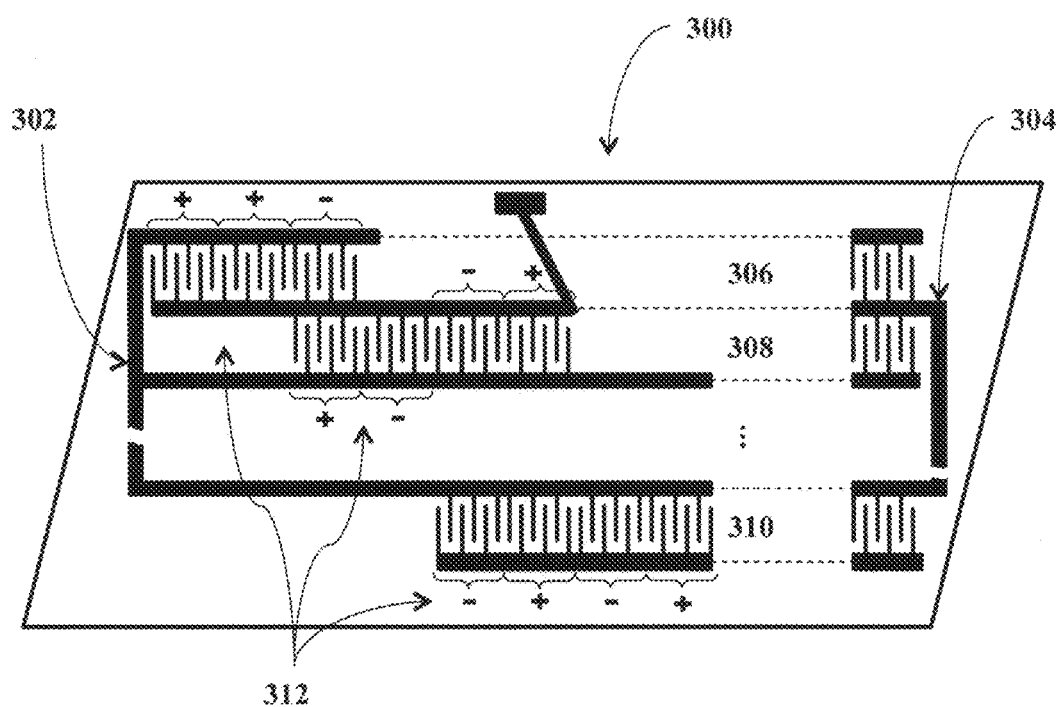
FIG. 15 shows a generalized device embodiment where the transducers have been implemented in multiple acoustic tracks.

FIG. 15 illustrates that embodiments similar to that in FIG. 14 can be extended to include as many acoustic tracks as needed to implement longer codes, to avoid overcoupling. Device 300 in this example includes a number (>3) of acoustic tracks 306, 308, . . . , 310, each containing a portion of the spread spectrum code bits 312 in transducer 302, and a receiving transducer segment in output transducer 304. As mentioned previously, this device can be interrogated wirelessly using one or two antennas, or can be measured in a wired format.

Figure 16:
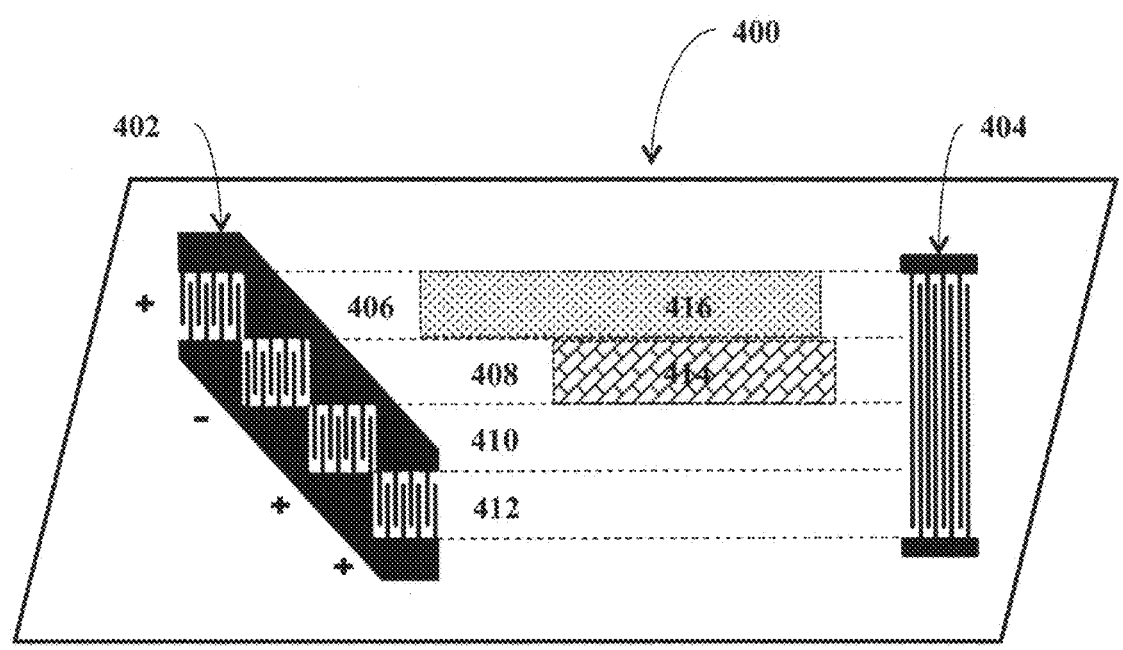
FIG. 16 shows a slanted transducer implementation of the DSSS coded transducer, wherein each bit of the code is in a separate acoustic track. A single, wide acoustic track transducer is shown as an output transducer by way of example. Two different surface treatments are illustrated in the top two acoustic tracks, which can be used to implement different sensing functions.

FIG. 16 shows an embodiment where device 400 includes slanted transducer 402, conventional transducer 404 (which is shown as a wide aperture transducer in this example), and four acoustic tracks 406, 408, 410, and 412. In this example, only one bit of the spread spectrum code is shown in each track of transducer 402, although more can be included. Two surface treatments 414 and 416 are shown, which can be chemically sensitive films (for use in chemical sensors), biological moieties (for biosensors), or other treatments that will implement the desired sensor function in those tracks.

Figure 17:
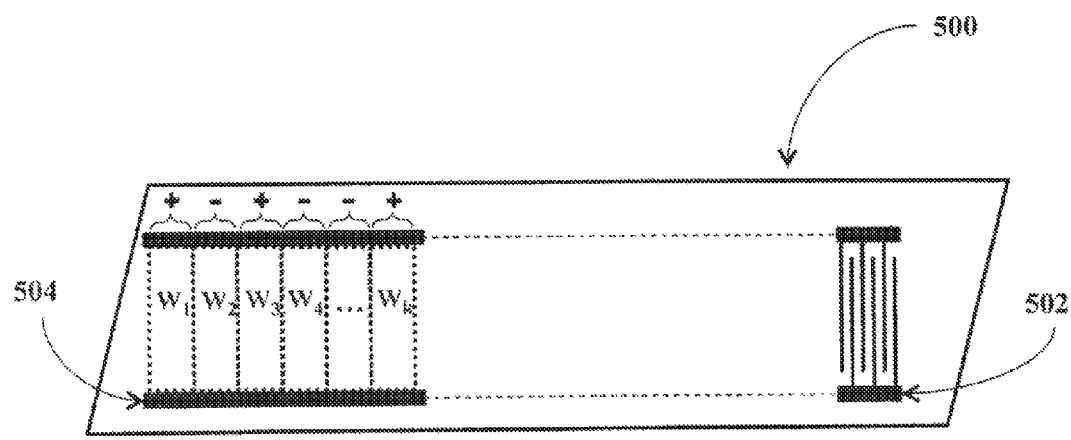
FIG. 17 illustrates schematically an amplitude weighted spread spectrum coded device.

FIG. 17 illustrates schematically an amplitude weighted spread spectrum coded device 500 that includes a traditional uncoded transducer 502 and an amplitude weighted spread spectrum coded transducer 504. The coded transducer 504 includes a number "k" of code bits, each of which is amplitude weighted by a weighting factor, indicated by $W_1$ through $W_k$ in FIG. 17. This figure illustrates a coded transducer embodiment that utilizes a single acoustic track, but extension of this concept to produce amplitude weighted coded transducers spanning multiple acoustic tracks is also within the scope of the present invention.

Figure 18:
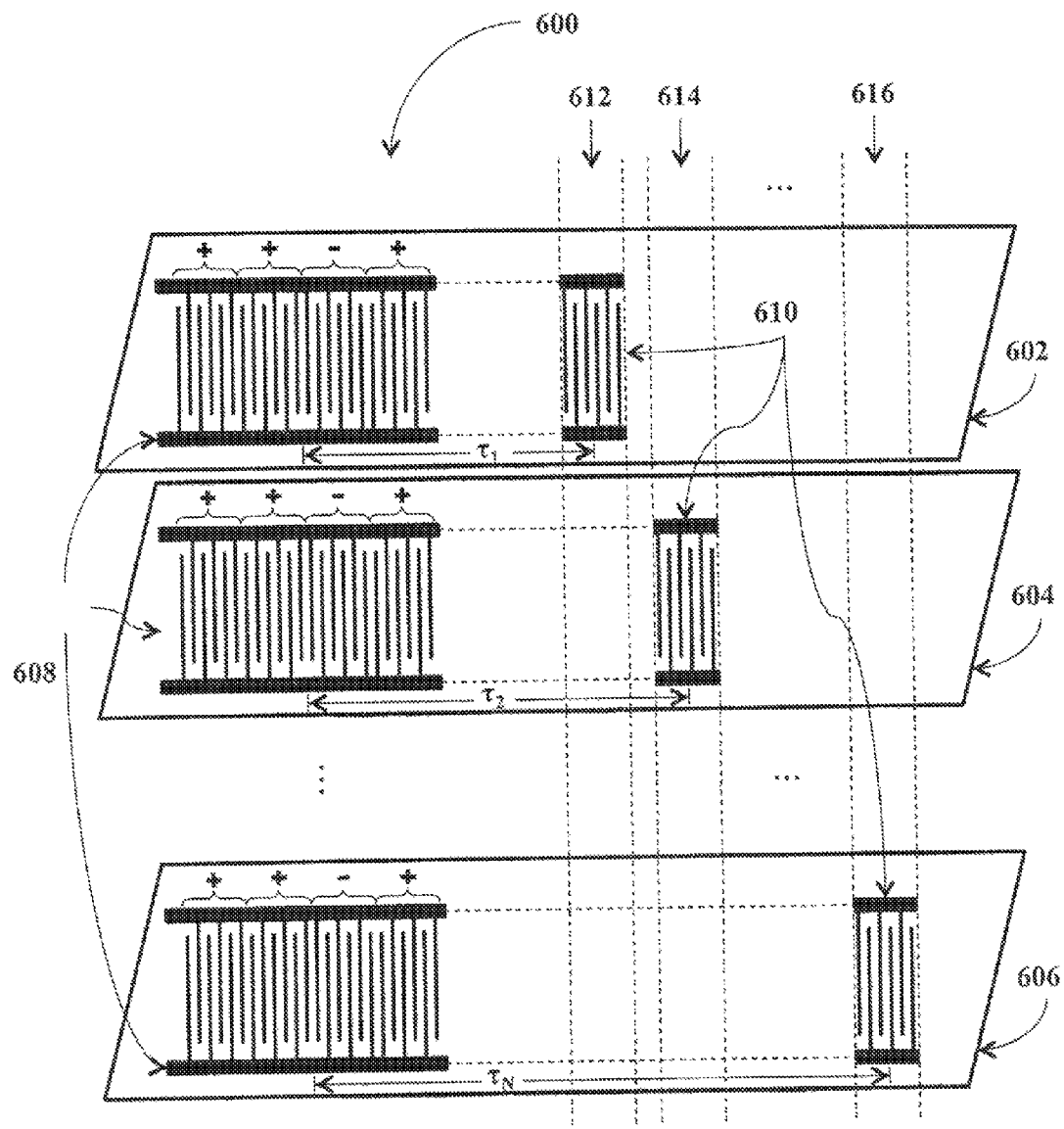
FIG. 18 illustrates schematically a set of spread spectrum coded devices utilizing time diversity.

FIG. 18 illustrates schematically a set 600 of N spread spectrum coded devices 602, 604, through 606 utilizing time diversity. As can be seen from the coded transducers 608 in FIG. 18, the operating frequency and spread spectrum codes utilized in each device in the set are the same. Output transducers 610 are illustrated as being the same SAW elements in each device (602 through 606), with the output transducer on each device being located within one of a set of specified time slots $\tau_1$ through $\tau_N$, indicated by 612, 614 through 616 in FIG. 18. A system reading this set of sensors can identify which device is responding by determining which time slot the detected correlation peak occurs within. This schematic illustration, as is the case for all of the illustrations of diversity techniques herein, shows just one acoustic track, and as above can be extended to multiple acoustic paths. Also, for all of the illustrative embodiments shown, practical sensors utilizing this technique would generally have more than one response combined to make a measurement (at least one reference response and at least one sensing response). Thus a practical device would normally include at least two sets of the SAW elements illustrated in FIG. 18 (or the other illustrations shown), or some combination thereof.

Figure 19:
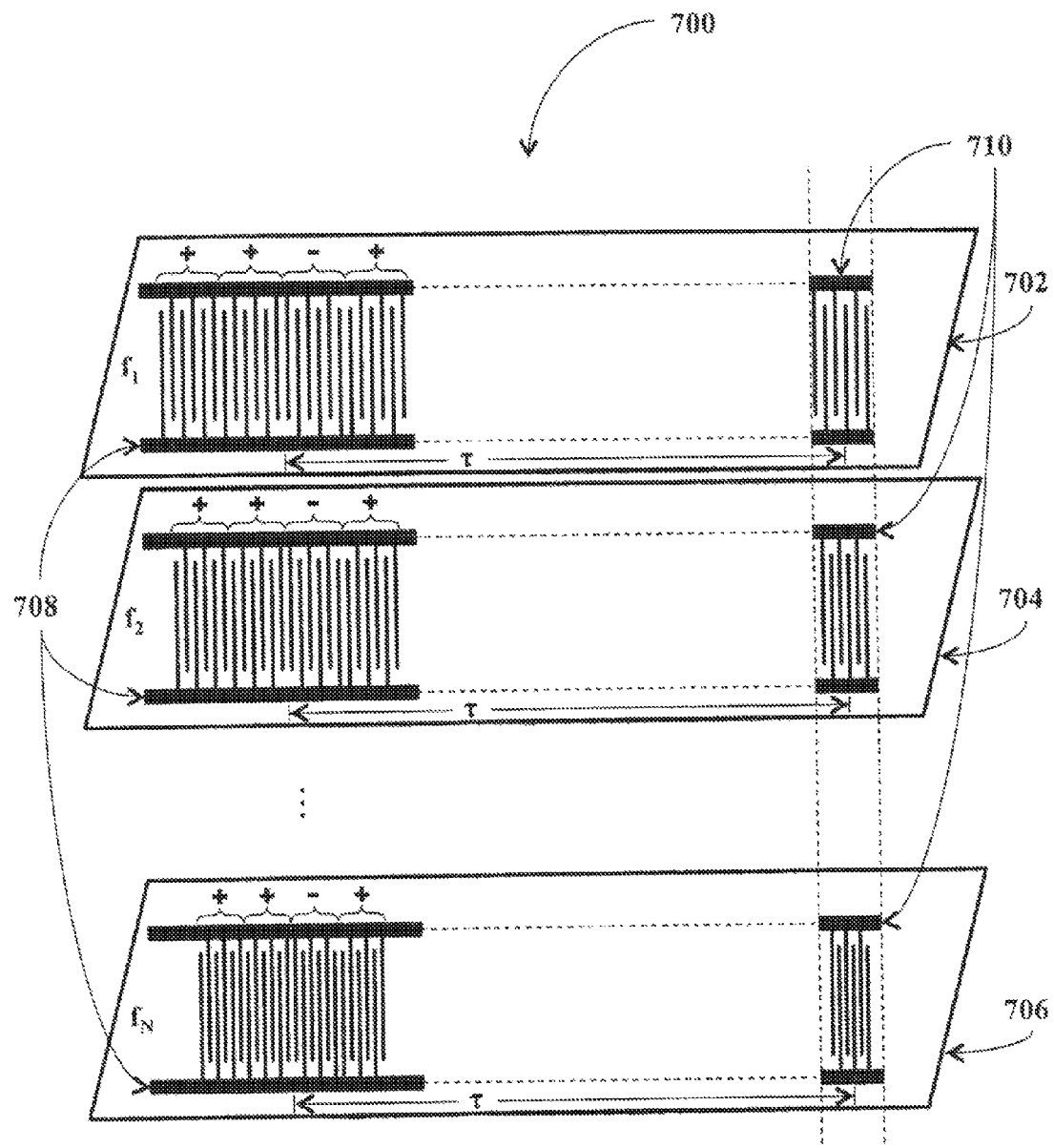
FIG. 19 illustrates schematically a set of spread spectrum coded devices utilizing frequency diversity.

FIG. 19 illustrates schematically a set 700 of spread spectrum coded devices 702, 704 through 706, utilizing frequency diversity. As can be seen from the coded transducers 708 in FIG. 19, the spread spectrum codes utilized in each device in the set are the same (there is no code diversity). As in other illustrative examples, the specific code shown is for convenience of schematic representation only, and has no significance. As and additional diversity technique, the operating frequency of each of the transducers varies for each device, indicated in FIG. 19 by the variation in electrode spacing for the transducers in device 702 as compared to device 704 or device 706, or others in the set. Output transducers 710 are illustrated as being the same SAW elements in each device (702 through 706), adjusted to operate at the frequency of the input transducer, with the output transducer on each device being located within the same specified time slots (selected from the set of possible time slots $\tau_1$ through $\tau_N$), with the selected delay indicated by τ in FIG. 19.

Figure 20:
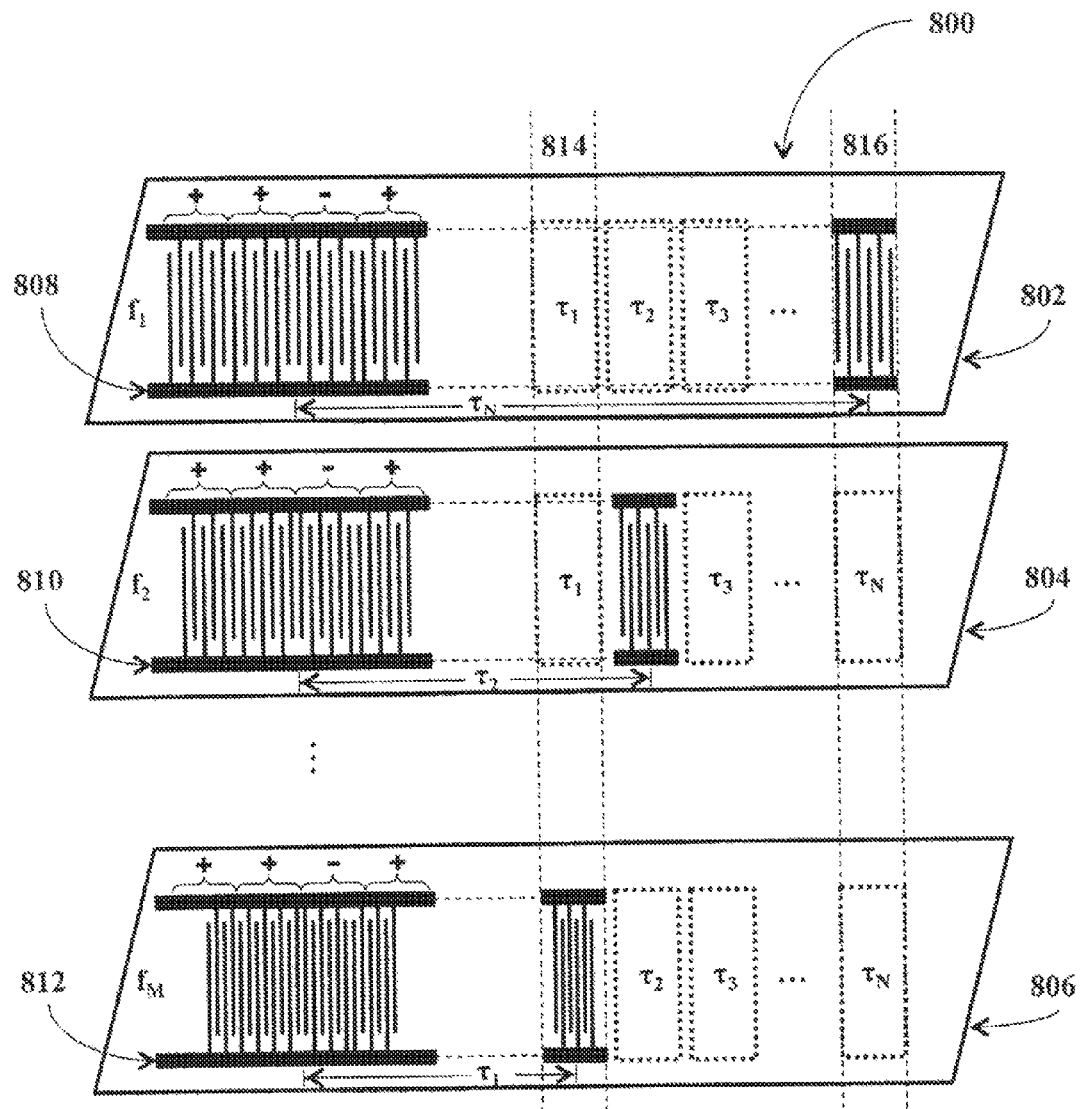
FIG. 20 illustrates schematically a set of spread spectrum coded devices utilizing both time and frequency diversity.

FIG. 20 illustrates schematically a set 800 of spread spectrum coded devices 802, 804 through 806, utilizing both time and frequency diversity. On each device, the possible time slots for the output transducer positioning are shown with dashed rectangles, each of which is labeled with the acoustic delay corresponding to the center of that time slot (τ1 through $\tau_N$). Time diversity if implemented by placing the output transducer in one of the time slots for each device, so that for a given operating frequency there can be N devices with different time delays operable. The first time slot is indicated by 814, while the last time slot is 816. Frequency diversity is implemented by including devices operating at M different frequencies ($f_1$ through $f_M$) within the same set. In FIG. 20, device 802 has coded transducer

808 operating at frequency $f_1$, with a matched frequency output transducer. Similarly, device 804 has coded transducer 810 operating at frequency $f_2$, and device 806 has coded transducer 812 operating at frequency $f_M$. For each operating frequency ($f_1$ through $f_M$), distinct devices can be constructed with output transducers in up to N time slots, producing a set of M×N distinct devices. As previously mentioned, functional sensor devices often operate in a differential manner, and sets of two or more distinguishable responses can be combined within the same sensor (on one or more substrates) to implement various sensor and tag devices.

Figure 21:
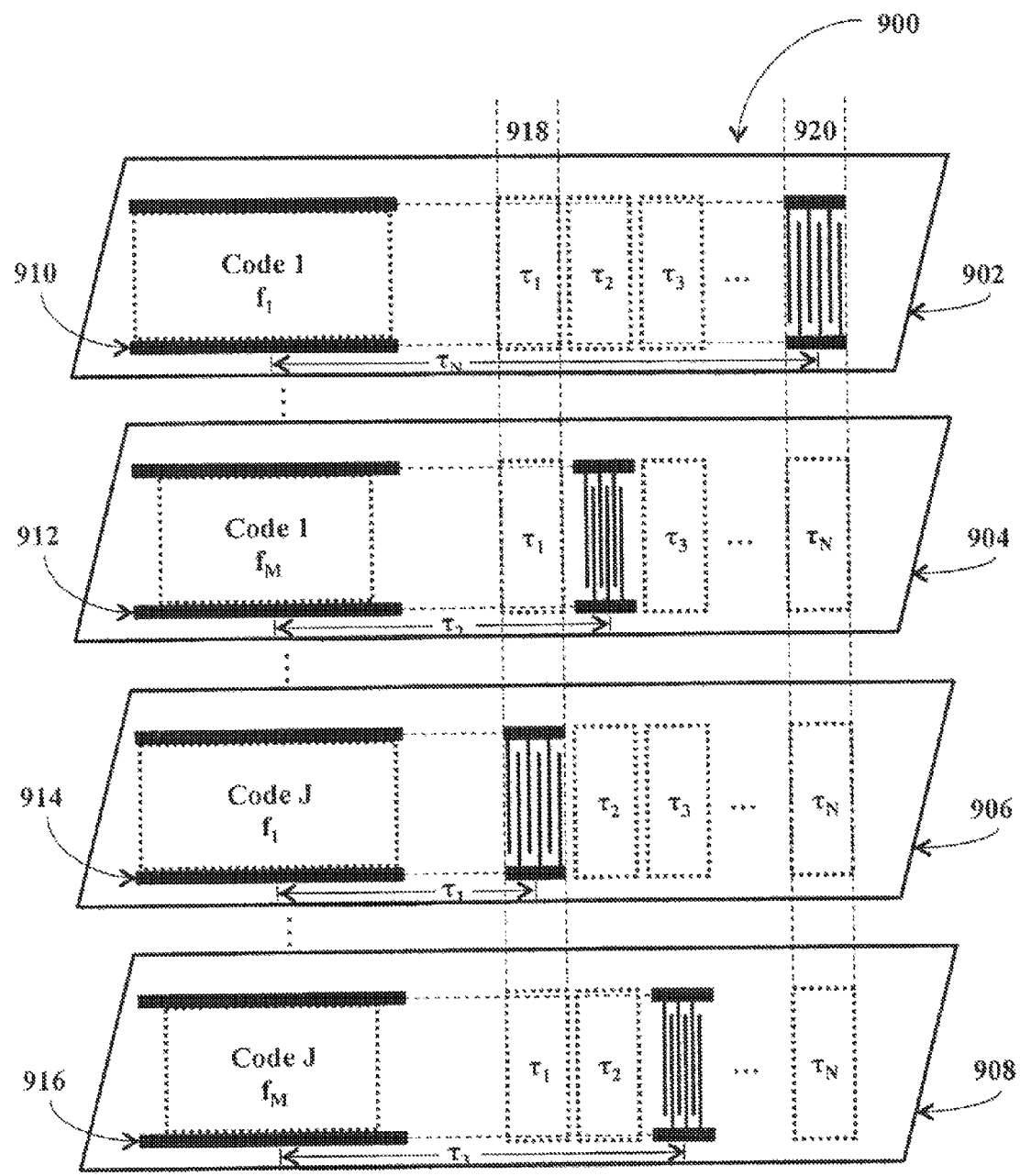
FIG. 21 illustrates schematically a set of spread spectrum coded devices utilizing code diversity, time diversity, and frequency diversity.

FIG. 21 illustrates schematically a set 900 of spread spectrum coded devices 902 through 904 through 906 through 908 utilizing code diversity, time diversity, and frequency diversity. A set of J codes (codes 1 through J), are combined with a set of M operating frequencies ($f_1$ through $f_M$), and with a set of N time delays ($\tau_1$ through $\tau_N$), producing a set of up to J*M*N possible individually identifiable device responses. Note that the time slots are aligned between devices, as indicated in slot a (918) and slot N (920). As previously, these may be used individually or together in sets to effect desired sensing and identification functions. By way of illustration, in FIG. 21 transducer 910 utilizes code 1 at frequency $f_1$, with the output transducer in time slot N. Transducer 912 utilizes code 1 at frequency $f_M$, with the output transducer in time slot 2. Transducer 914 utilizes code J at frequency $f_1$, with the output transducer in time slot 1. Transducer 916 utilizes code J at frequency $f_M$, with the output transducer in time slot 3. Since the set of possible combinations is large, only four devices are shown in FIG. 21 by way of example.

Figure 22:
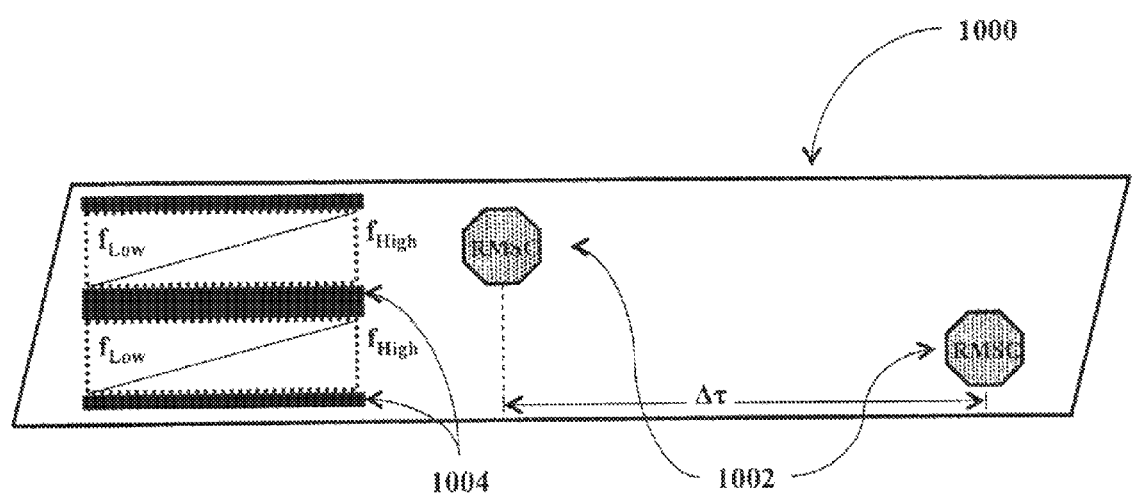
FIG. 22 shows a differential delay line reflective temperature sensor utilizing yet another diversity technique that can be incorporated with time diversity and frequency diversity, specifically chirp slope diversity, with reflective multistrip coupler reflectors.
Figure 23:
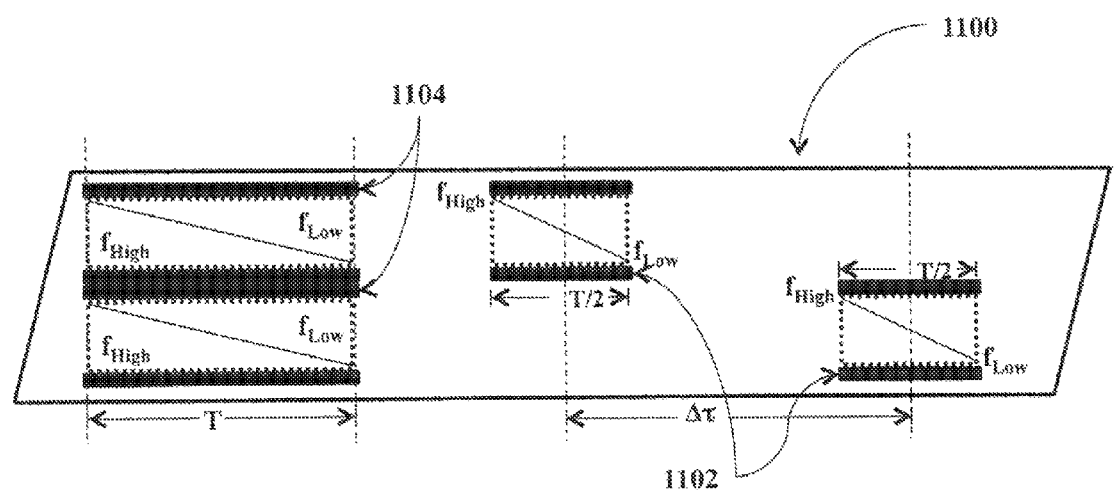
FIG. 23 shows a differential delay line reflective temperature sensor utilizing chirped reflectors.

FIGS. 22 and 23 show yet another diversity technique that can be incorporated with time diversity and frequency diversity, specifically chirp slope diversity. Chirp slope diversity takes the place of code diversity, producing sets of individually identifiable devices of size equal to (# of time slots)*(number of frequency bands)*(number of different chirp slopes).

FIG. 22 shows a simple differential reflective delay line temperature sensor 1000 embodiment utilizing chirped input transducers 1004 and reflective multistrip couplers (RMSC) 1002. The time different $\Delta\tau$ between the RMSC reflectors is doubled due to the reflective device operation, and provides for a sensitive temperature sensor response. Device 1000 has two input/output chirped transducers 1004, each of which has a varying frequency across the time length of the transducer. A linear upchirp (going from low to high frequency from left to right) is shown for simplicity, although different nonlinear chirps can be used, and both up and down chirps are useful). The input transducer chirp slope is ($f_{high}$−$f_{low}$)/(transducer length in time). The reflected responses from the RMSCs are further spread by the chirp transducers, and the spread spectrum response can be de-chirped in the receiver using the appropriate chirp (with a chirp sense that is the opposite of that introduced by the sensor). Although not shown, this technique can be combined with time and frequency diversity as mentioned, to produce larger sets of individually identifiable devices.

FIG. 23 shows yet another embodiment of a reflective differential delay line chirped temperature sensor 1100. In this embodiment, the RMSCs of FIG. 22 have been replaced with chirped SAW reflectors 1102. These reflectors 1102 are half the time length of the chirp transducers 1104, have the same chirp sense (up or down), and have the same chirp bandwidth. Hence the chirp slope of the reflectors is twice that of the transducers. For a given die length, this embodiment may allow realization of a greater time bandwidth product (BT), resulting in greater processing gain for the sensors. The larger the time delay between reflected responses $\Delta\tau$, the greater the temperature sensitivity of the device. If time diversity is being utilized in connection with this embodiment, care must be taken to ensure that the separation $\Delta\tau$ is selected so that resulting reflections occur within desired time slots over the operating range of the device. Of course, different types of reflectors or output transducers can be utilized other than those illustrated herein without deviating from the intent of the present invention.

The illustrations included herein are exemplary in nature, and do not encompass all aspects of the present invention. One skilled in the art would recognize that the improvements provided by embodiments of this invention can be implemented using any of a wide range of known electrode structures, including but not limited to split electrodes, non-split electrodes, three electrodes per wavelength, and SPUDT structures. Symmetric codes can be implemented using reflector structures. The use of chirp transducers with varying chirp slopes is also within the scope of embodiments of the present invention. It should be noted that the one-sided layout of the devices in FIG. 3 could equally well be implemented using a two-sided die, with reflectors or output transducers on one side of the input/output transducer. Performance of such two sided devices would clearly be affected by the time orientation of the spread spectrum code.

One skilled in the art will recognize that there are a wide range of device embodiments that can be used to implement sensor, tag, and sensor tag devices according to embodiments of the present invention. All of the devices described and/or illustrated can be implemented in single-track formats, or in multiple acoustic track formats. They can be provided with electrical shorting pads in the deposition region(s) or portions thereof and/or the reference acoustic path(s) or portions thereof, if beneficial for the desired application (to separate the electrical effects of the deposited film from the mass loading and viscoelastic properties). Inclusion of a temperature sensor device allows extraction of the effects of temperature, which can be done using the delay of the integral reference peak(s), or with separate temperature sensing elements as discussed above. Inclusion of multiple differential delay lines, preferably operable in different frequency ranges, with different coating treatments allows separation of conductive effects from those involving mass loading and viscoelasticity.

The transducers and/or reflectors described thus far are all non-dispersive, and similar embodiments could be envisioned that utilize transducers that are tapered, slanted, stepped tapered, apodized, withdrawal weighted, EWC, UDT, SPUDT, dispersive, and/or waveguide structures. Even a reflective array compressor structure could be used to implement such a deposition monitor, although such a device structure would be unnecessarily complex for most applications. All of these techniques could also be used incorporating dispersive and harmonic techniques.

Also, one skilled in the art will recognize that these devices can be implemented on various substrate materials, and can utilize various acoustic wave propagation modes, in order to achieve performance required for specific applications. Performance to measure deposition of or interaction with vapors, liquids, polymers, solids, and numerous other quantities can be achieved. Operation at high temperatures can be accomplished using langasite, langanite, of langatate, or other substrate capable of operating at high temperatures. In order to measure conductive films, a substrate with high electromechanical coupling coefficient may be used. Electrodes and busbars of SAW elements can be made from materials appropriate to survive the application environment, including the ability to withstand high or low temperatures, and chemical environments.

The broad nature of the embodiments described here are clear, and one skilled in the art will understand that there is a wide variety of device configurations that can be generated using combinations of one or more of the techniques discussed. The embodiments of the inventions described herein and illustrated in the figures provide device embodiments capable of monitoring deposition of a wide range of materials, including but not limited to ultrathin films and nanomaterials. While some preferred forms and embodiments of the invention have been illustrated and described, it will be apparent to those of ordinary skill in the art that various changes and modification may be made without deviating from the inventive concepts set forth above.

Embodiments of the present invention have been described in relation to particular examples, which are intended in all respects to be illustrative rather than restrictive. Those skilled in the art will appreciate that many different combinations of materials and components will be suitable for practicing the disclosed embodiments of the present invention.

Other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:

1. A set of two or more individually identifiable surface acoustic wave sensor tag devices
   (a) at least one piezoelectric substrate;
   (b) a first SAW element comprising a transducer formed on a region of said piezoelectric substrate for transducing a signal;
   (c) at least two additional SAW elements formed on said piezoelectric substrate;
   (d) a pair of acoustic wave propagation paths that are defined by the position of said SAW elements relative to the crystal axes of the substrate, wherein:
      (i) the paths each respond differently to variations in an external parameter to be sensed; and
      (ii) said pair of acoustic wave propagation paths produce responses with a specified pedestal delay and a differential delay between them; and
   (e) wherein the specified pedestal delay of each said sensor is selected from a quantized set of delays; and
   (f) wherein at least one of said SAW elements in each of said sensor tag devices implements at least one direct sequence spread spectrum (DSSS) code; and
   (g) wherein said DSSS code of each sensor is selected from a defined set of DSSS codes; and
   (h) wherein each of said sensor tag devices incorporates at least one operating center frequency; and
   (i) wherein said operating center frequency is selected from a set of discrete frequencies; and
   (j) wherein said set of discrete frequencies is selected such that frequency responses from devices operating at the discrete frequencies do not substantially overlap; and
   (k) wherein the combination of the specified pedestal delay, the operating center frequency, and the DSSS code of each sensor provides a means of discrimination between sensors for individual device identification.

2. A set of two or more individually identifiable surface acoustic wave sensor tag devices
   (a) at least one piezoelectric substrate;
   (b) a first SAW element comprising a transducer formed on a region of said piezoelectric substrate for transducing a signal;
   (c) at least two additional SAW elements formed on said piezoelectric substrate;
   (d) a pair of acoustic wave propagation paths that are defined by the position of said SAW elements relative to the crystal axes of the substrate, wherein:
      (i) the paths each respond differently to variations in an external parameter to be sensed; and
      (ii) said pair of acoustic wave propagation paths produce responses with a specified pedestal delay and a differential delay between them; and
   (e) wherein the specified pedestal delay of each said sensor is selected from a quantized set of delays; and
   (f) wherein at least one of said SAW elements in each of said sensor tag devices contains at least one chirp slope; and
   (g) wherein said chirp slope is selected from a defined set of at least two distinct chirp slopes; and
   (h) wherein each of said sensor tag devices incorporates at least one operating center frequency; and
   (i) wherein said operating center frequency is selected from a set of discrete frequencies; and
   (j) wherein said set of discrete frequencies is selected such that frequency responses from devices operating at the discrete frequencies do not substantially overlap; and
   (k) wherein the combination of the specified pedestal delay, the operating center frequency, and the chirp slope of each sensor provides a means of discrimination between sensors for individual device identification.

3. A set of two or more individually identifiable surface acoustic wave sensor tag devices, each of the wave sensor tag devices comprising a pair of acoustic wave propagation paths that produce responses with a specified pedestal delay and a differential delay between them,
   wherein each of the wave sensor tag devices implements at least one direct sequence spread spectrum (DSSS) code and incorporates at least one operating center frequency selected from a set of discrete frequencies,
   wherein the set of discrete frequencies is selected such that frequency responses from devices operating at the discrete frequencies do not substantially overlap, and
   wherein the combination of the specified pedestal delay, the operating center frequency, and the DSSS code of each sensor provides a means of discrimination between sensors for individual device identification.

4. A set of two or more individually identifiable surface acoustic wave sensor tag devices, each of the wave sensor tag devices comprising a pair of acoustic wave propagation paths that produce responses with a specified pedestal delay and a differential delay between them,
   wherein each of the wave sensor tag devices comprises a plurality of SAW elements containing at least one chirp slope, and incorporates at least one operating center frequency selected from a set of discrete frequencies,
   wherein the set of discrete frequencies is selected such that frequency responses from devices operating at the discrete frequencies do not substantially overlap, and
   wherein the combination of the specified pedestal delay, the operating center frequency, and the chirp slope of each sensor provides a means of discrimination between sensors for individual device identification.

* * * * *